(12) United States Patent
Ho et al.

(10) Patent No.: US 12,451,415 B2
(45) Date of Patent: Oct. 21, 2025

(54) SEMICONDUCTOR DEVICE PACKAGE, ELECTRONIC ASSEMBLY AND METHOD FOR MANUFACTURING THE SAME

(71) Applicant: Advanced Semiconductor Engineering, Inc., Kaohsiung (TW)

(72) Inventors: Cheng-Lin Ho, Kaohsiung (TW);
Chih-Cheng Lee, Kaohsiung (TW);
Chun Chen Chen, Kaohsiung (TW);
Cheng Yuan Chen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 3 days.

(21) Appl. No.: 18/370,320

(22) Filed: Sep. 19, 2023

(65) Prior Publication Data

US 2024/0088001 A1     Mar. 14, 2024

Related U.S. Application Data

(63) Continuation of application No. 17/140,926, filed on Jan. 4, 2021, now Pat. No. 11,764,137, which is a
(Continued)

(51) Int. Cl.
*H01L 23/498*     (2006.01)
*H01L 21/48*     (2006.01)
(Continued)

(52) U.S. Cl.
CPC .... *H01L 23/49816* (2013.01); *H01L 21/4853* (2013.01); *H01L 21/56* (2013.01);
(Continued)

(58) Field of Classification Search
CPC ........... H01L 23/49816; H01L 21/4853; H01L 21/56; H01L 23/3128; H01L 23/49838;
(Continued)

(56) References Cited

U.S. PATENT DOCUMENTS 8,981,560 B2    3/2015    Jensen et al.
9,595,511 B1 *    3/2017    Haba ...................... G11C 5/063
(Continued)

FOREIGN PATENT DOCUMENTS

CN     107535049 A     1/2018
CN     108269768 A     7/2018
(Continued)

OTHER PUBLICATIONS

Non-Final Office Action for U.S. Appl. No. 16/264,602, issued May 20, 2020, 8 pages.
(Continued)

*Primary Examiner* — Yasser A Abdelaziz
(74) *Attorney, Agent, or Firm* — FOLEY & LARDNER LLP

(57) ABSTRACT

A semiconductor device package includes a carrier, an electronic component, a connection element and an encapsulant. The electronic component is disposed on a surface of the carrier. The connection element is disposed on the surface and adjacent to an edge of the carrier. The encapsulant is disposed on the surface of the carrier. A portion of the connection element is exposed from an upper surface and an edge of the encapsulant.

13 Claims, 28 Drawing Sheets

Related U.S. Application Data continuation of application No. 16/264,602, filed on Jan. 31, 2019, now Pat. No. 10,886,208.

(60) Provisional application No. 62/745,222, filed on Oct. 12, 2018.

(51) Int. Cl.
  *H01L 21/56* (2006.01)
  *H01L 23/31* (2006.01)
  *H05K 1/18* (2006.01)
  *H05K 3/34* (2006.01)

(52) U.S. Cl.
  CPC .... *H01L 23/3128* (2013.01); *H01L 23/49838* (2013.01); *H05K 1/181* (2013.01); *H05K 3/341* (2013.01); *H05K 2201/10446* (2013.01); *H05K 2201/10522* (2013.01)

(58) Field of Classification Search
  CPC ............... H01L 2224/13; H01L 21/561; H01L 23/49805; H01L 25/105; H01L 24/11; H01L 24/13; H01L 2224/11005; H01L 2224/13015; H01L 2224/13017; H01L 23/49811; H01L 2224/13021; H01L 2224/13023; H05K 1/181; H05K 3/341; H05K 2201/10522; H05K 2201/10446
  See application file for complete search history.

(56) References Cited

U.S. PATENT DOCUMENTS

| | | | |
|---|---|---|---|
| 10,251,276 | B2 | 4/2019 | Bock et al. |
| 2002/0072148 | A1 | 6/2002 | Chen |
| 2005/0104220 | A1 | 5/2005 | Tsuchiya et al. |
| 2005/0135067 | A1 | 6/2005 | Park et al. |
| 2007/0278640 | A1 | 12/2007 | Weng et al. |
| 2009/0294914 | A1 | 12/2009 | Pagaila et al. |
| 2012/0182066 | A1* | 7/2012 | Merkle .................. H05K 1/185 427/508 |
| 2012/0228750 | A1 | 9/2012 | Okumura |
| 2013/0277836 | A1* | 10/2013 | Jensen .................... H01L 24/24 257/737 |
| 2014/0124910 | A1 | 5/2014 | Lee |
| 2014/0334109 | A1 | 11/2014 | Takagi |
| 2015/0008580 | A1 | 1/2015 | Joh |
| 2015/0235995 | A1 | 8/2015 | Park et al. |
| 2015/0325543 | A1 | 11/2015 | Katkar et al. |
| 2018/0040544 | A1 | 2/2018 | Katkar et al. |
| 2018/0070450 | A1 | 3/2018 | Bock et al. |
| 2018/0190607 | A1 | 7/2018 | Lin |
| 2018/0294247 | A1 | 10/2018 | Hung et al. |

FOREIGN PATENT DOCUMENTS

| | | |
|---|---|---|
| KR | 100923999 B | 10/2009 |
| KR | 20110124094 A | 11/2011 |
| TW | 466716 B | 12/2001 |

OTHER PUBLICATIONS

Non-Final Office Action for U.S. Appl. No. 17/140,926, issued Jan. 19, 2023, 8 pages.
Notice of Allowance for U.S. Appl. No. 16/264,602, issued Sep. 3, 2020, 10 pages.
Notice of Allowance for U.S. Appl. No. 17/140,926, issued May 9, 2023, 9 pages.
Office Action for corresponding Chinese Patent Application No. 201910308273.5, issued Apr. 30, 2025, 9 pages.
Search Report with English translation for corresponding Chinese Application No. 201910308273.5, issued Apr. 30, 2025, 5 pages.

\* cited by examiner

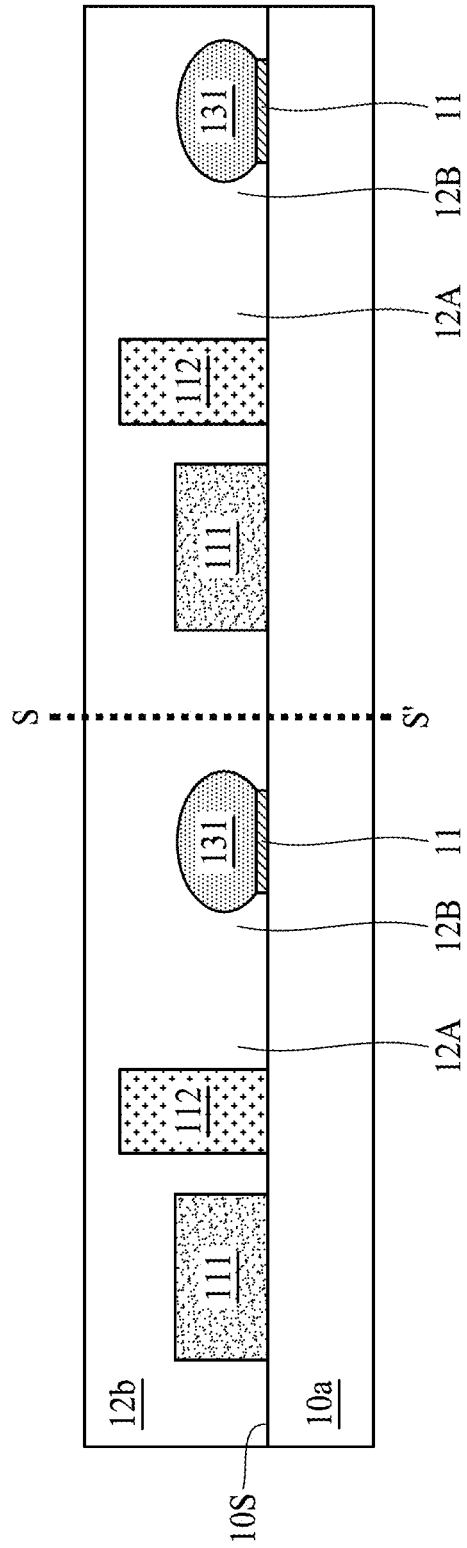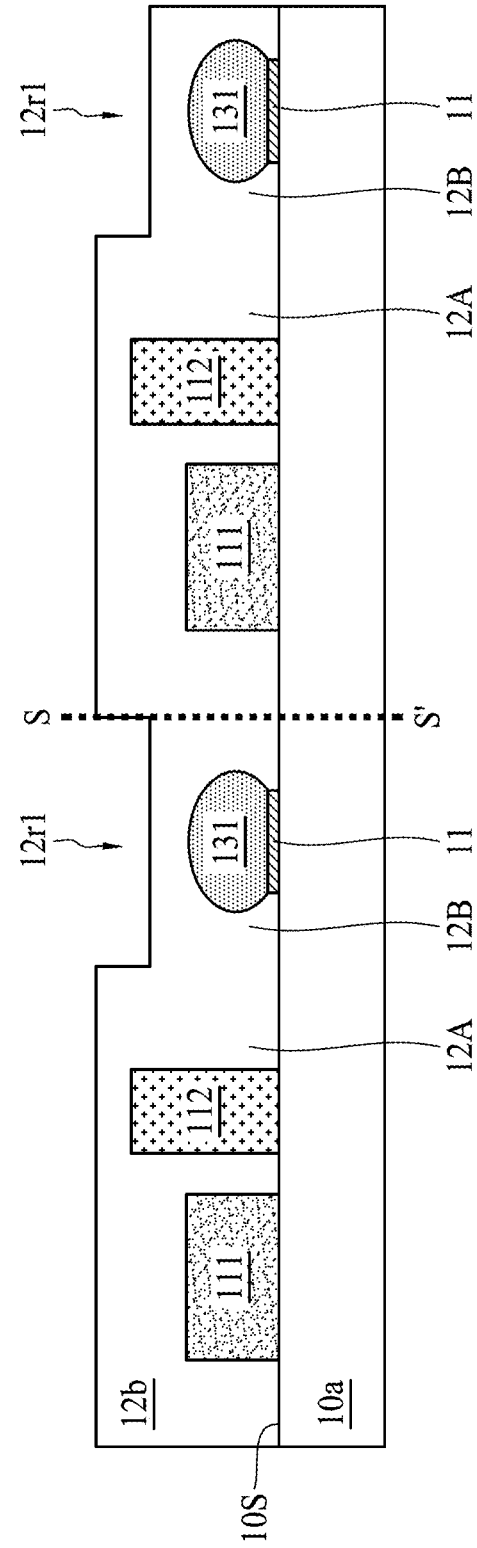
FIG. 1A
FIG. 1B

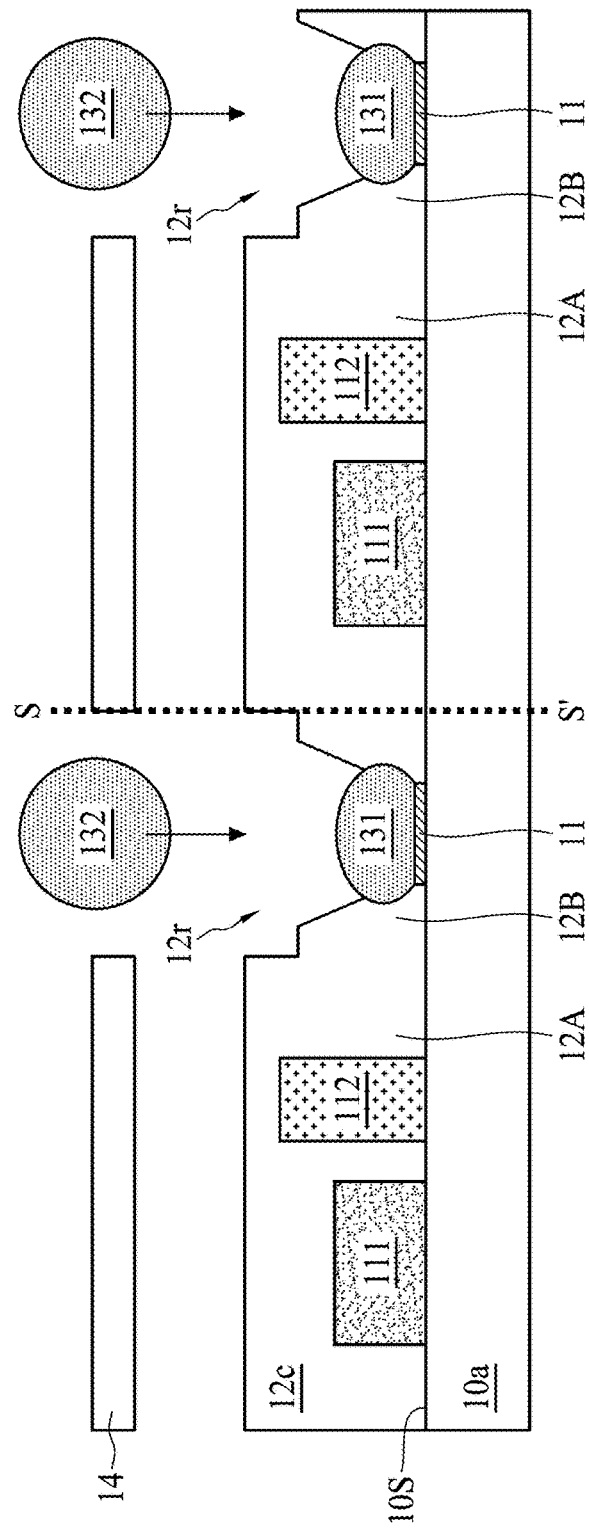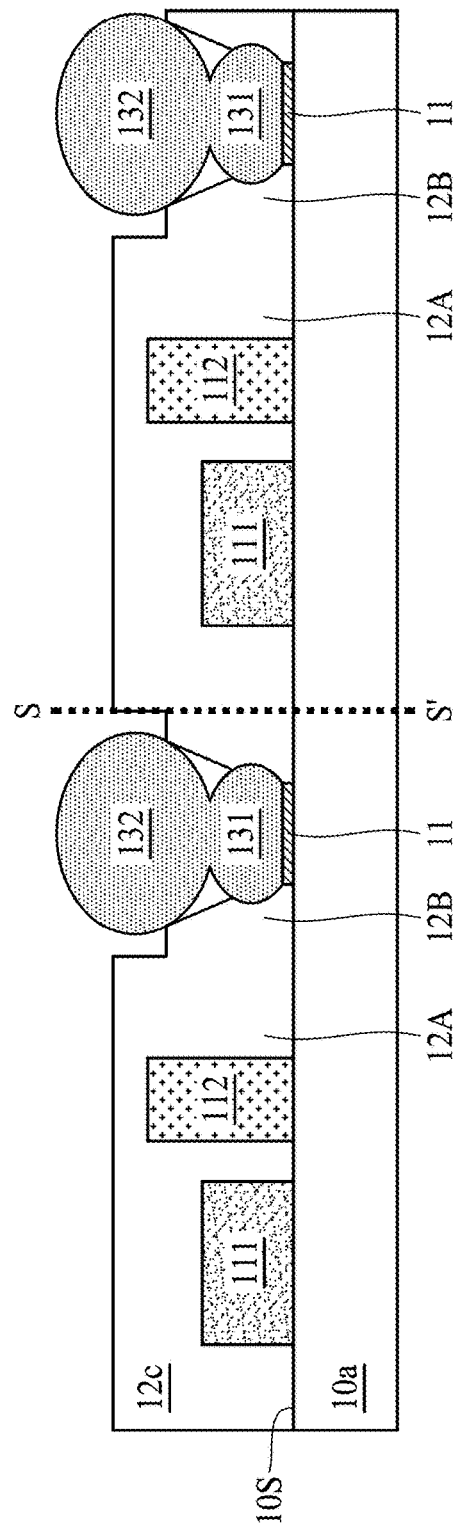

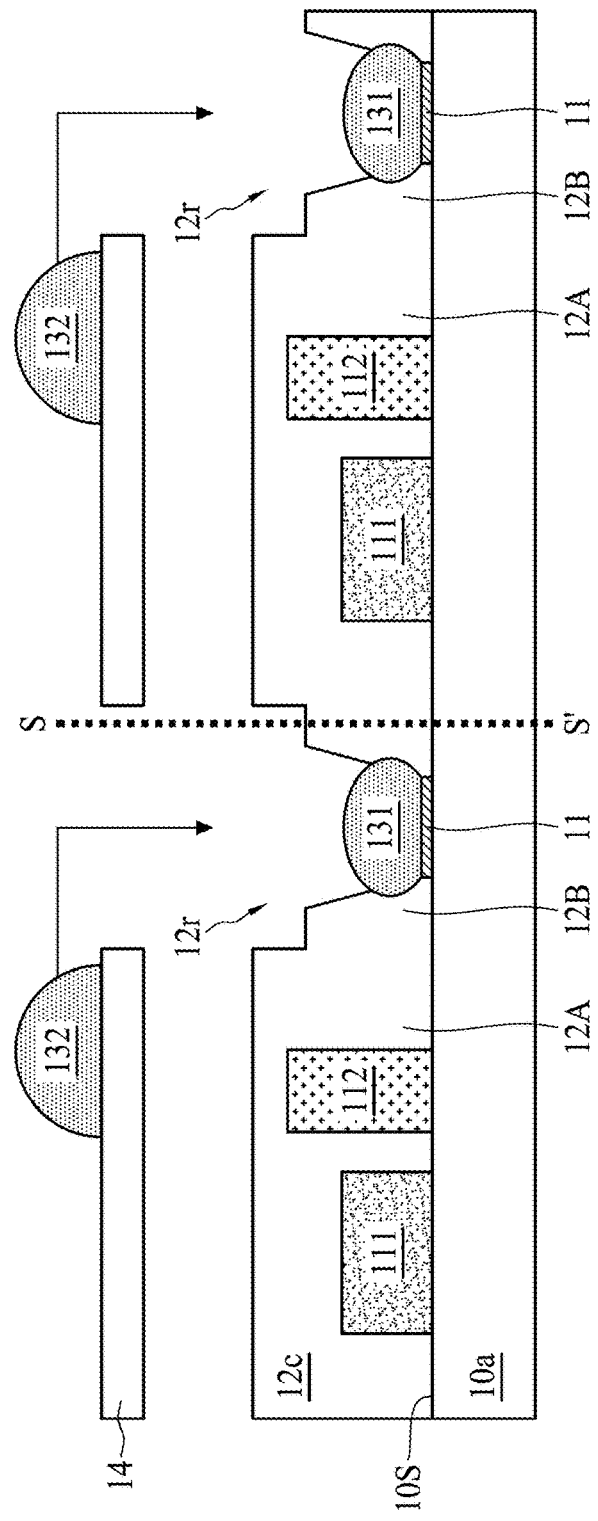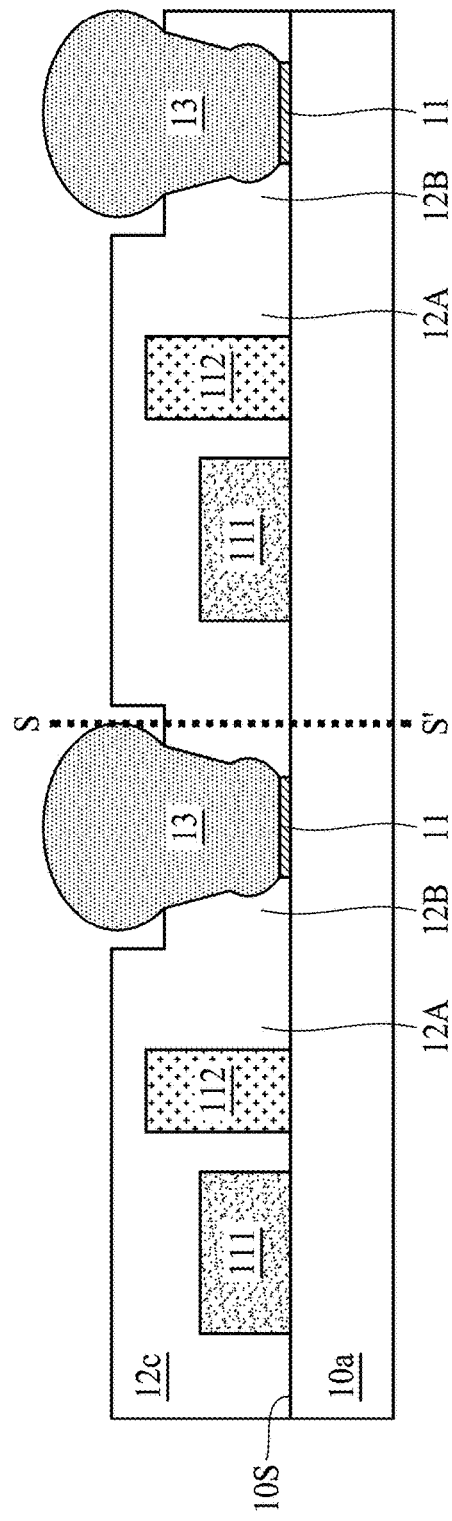

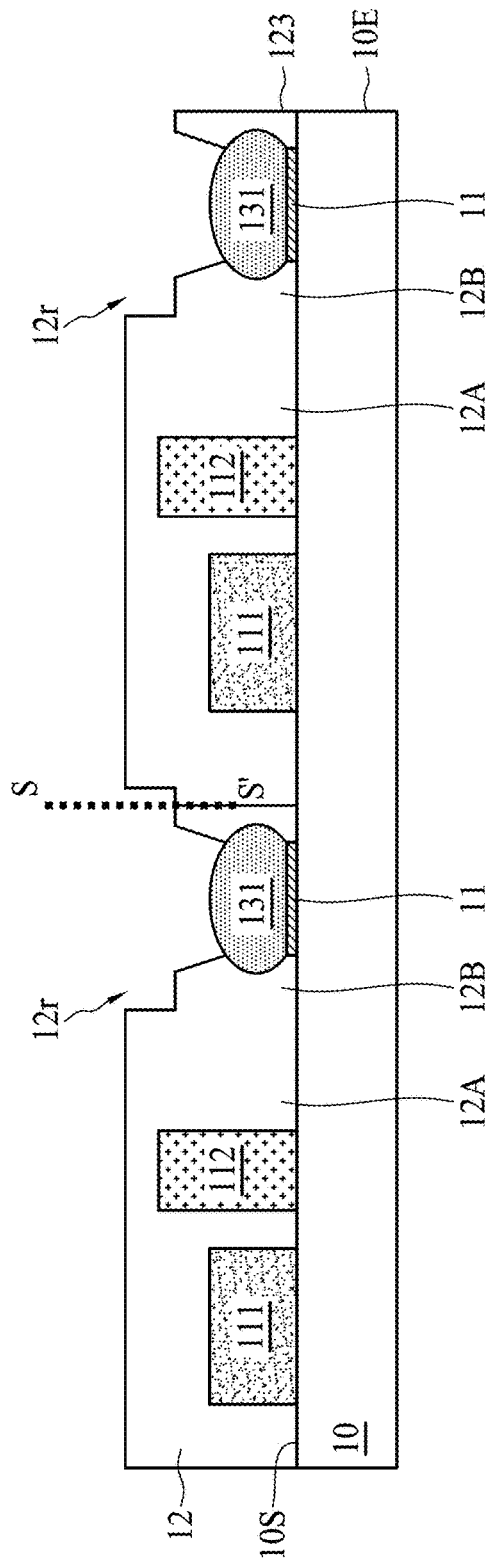
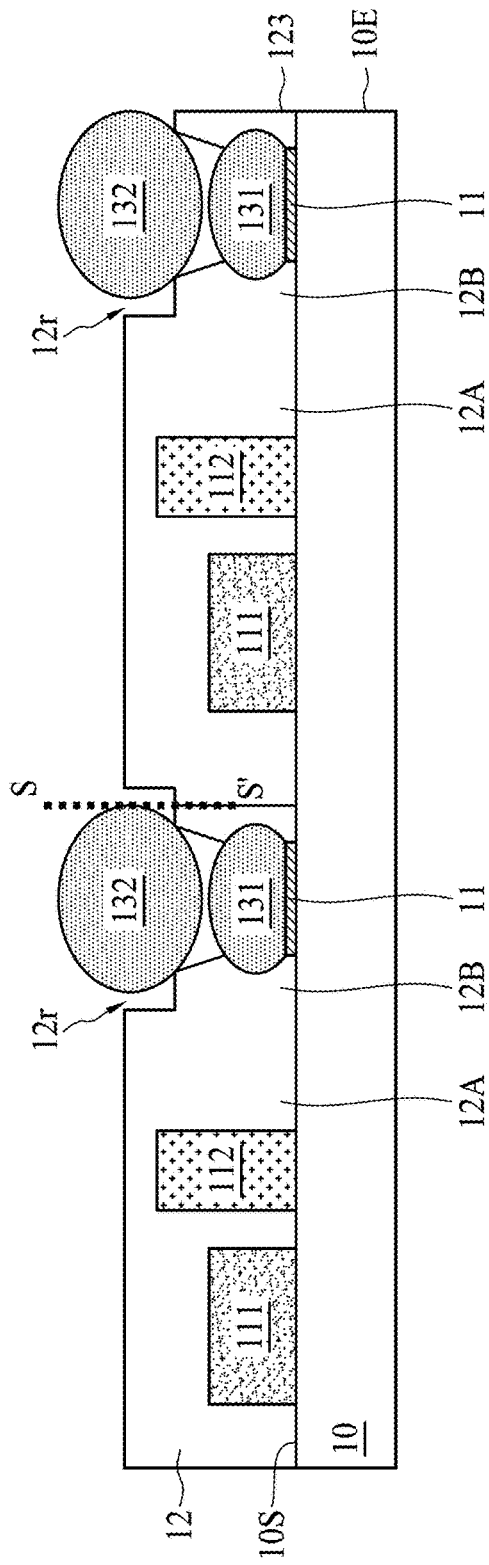
FIG. 3A
FIG. 3B

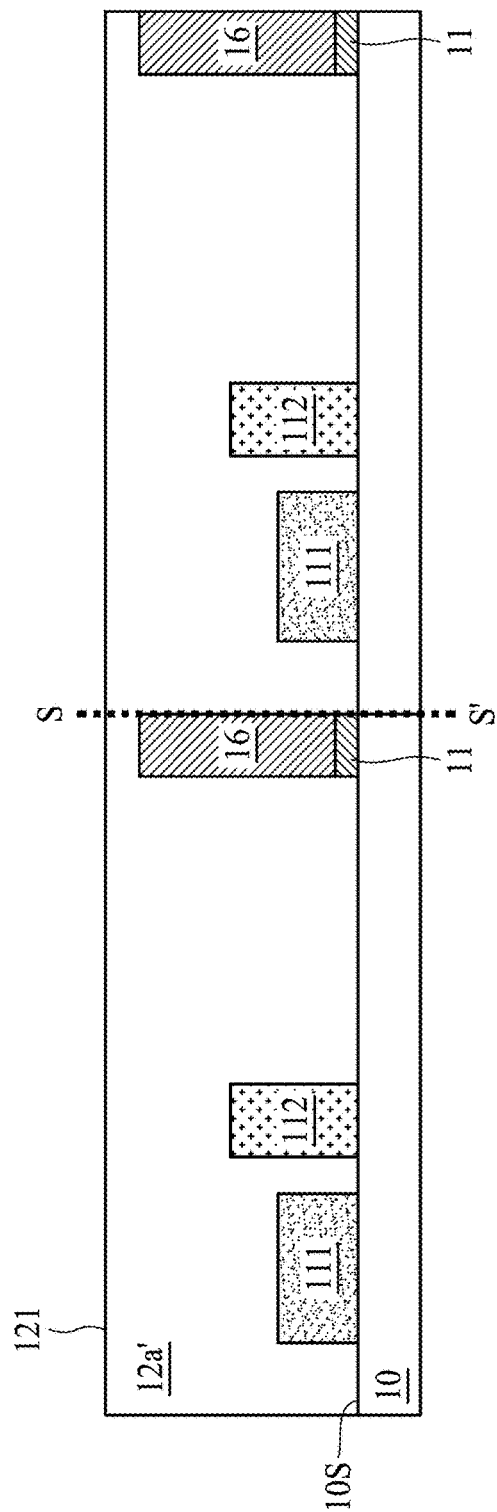
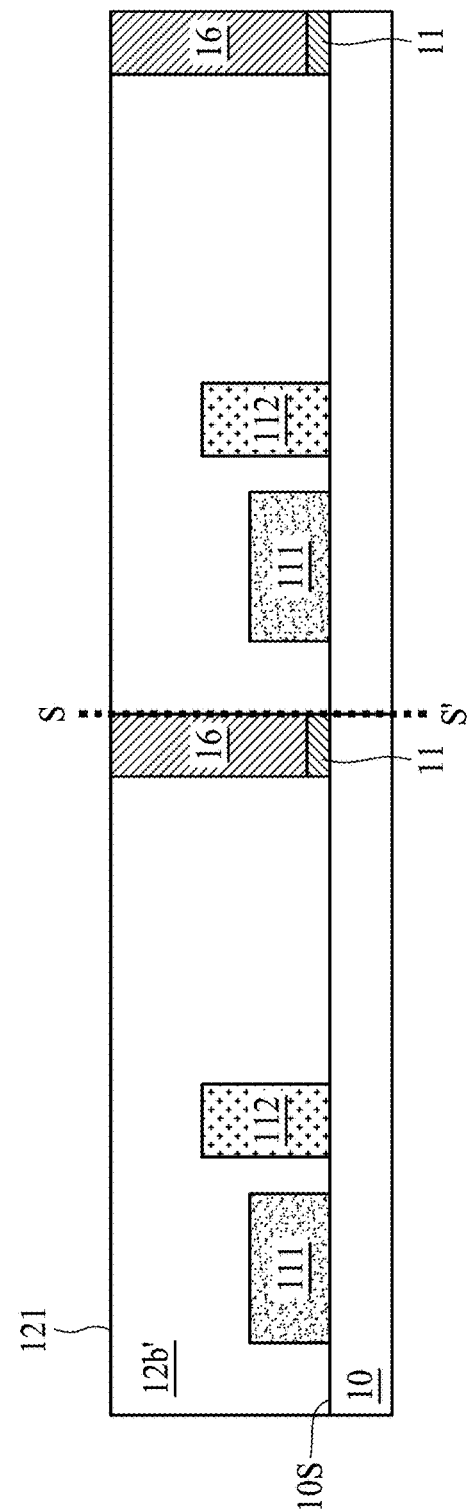
FIG. 5A
FIG. 5B

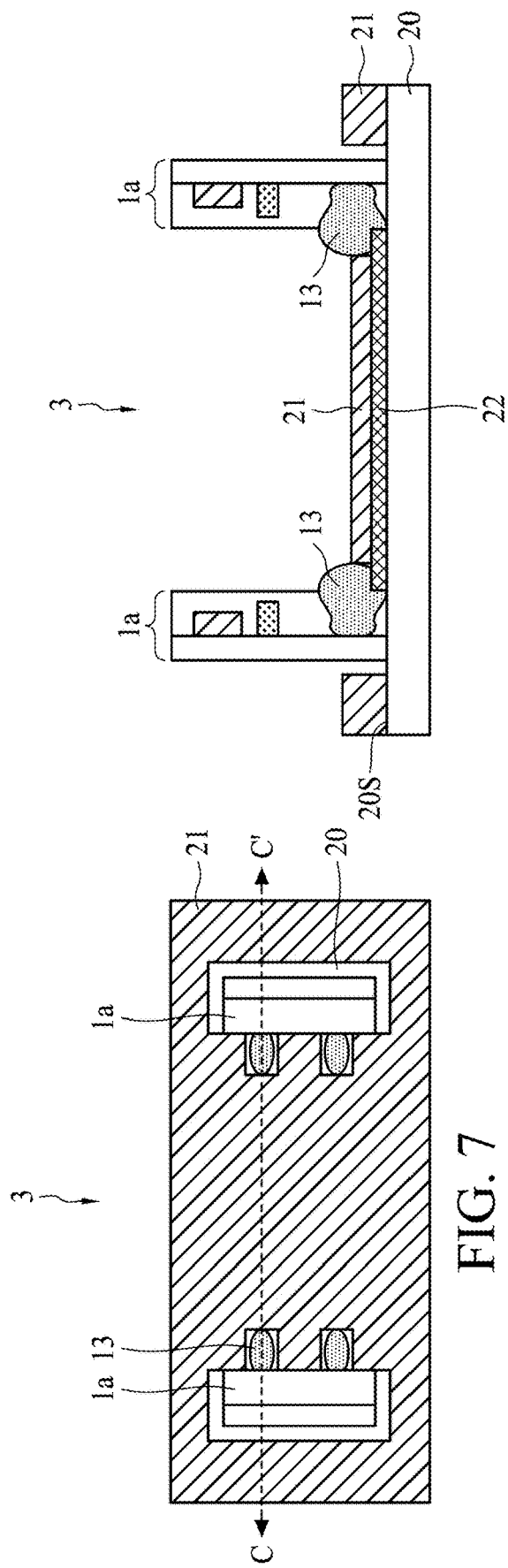

SEMICONDUCTOR DEVICE PACKAGE, ELECTRONIC ASSEMBLY AND METHOD FOR MANUFACTURING THE SAME

CROSS-REFERENCE TO RELATED APPLICATION

This application is a continuation of U.S. patent application Ser. No. 17/140,926, filed Jan. 4, 2021, which is a continuation of U.S. patent application Ser. No. 16/264,602 filed Jan. 31, 2019, now U.S. Pat. No. 10,886,208, which claims priority to and the benefit of U.S. Provisional Application No. 62/745,222, filed Oct. 12, 2018, the contents of which are incorporated herein by reference in their entireties.

BACKGROUND

1. Technical Field

The present disclosure relates to a semiconductor device package, an electronic assembly and method for manufacturing the same, and more particularly to a semiconductor device package and an electronic assembly including a connection element exposing from an upper surface and an edge of the encapsulant and method for manufacturing the same.

2. Description of the Related Art

A system in package (SIP) is a package including a plurality of chips, or a chip and other electronic components such as passive components e.g., capacitor and resistor, connector, antenna or the like. The SIP has been applied in various electronic products such as vehicle electronics and consumer electronics. With the miniaturization trend of electronic product, heat dissipation and antenna efficiency become issues to be addressed.

SUMMARY

In some embodiments, a semiconductor device package includes a carrier, an electronic component, a connection element and an encapsulant. The electronic component is disposed on a surface of the carrier. The connection element is disposed on the surface and adjacent to an edge of the carrier. The encapsulant is disposed on the surface of the carrier. A portion of the connection element is exposed from an upper surface and an edge of the encapsulant.

In some embodiments, an electronic assembly includes a board structure and a semiconductor device package attached to the board structure. The board structure includes a substrate, and a patterned conductive layer disposed on a surface of the substrate. The semiconductor device package includes a carrier, an electronic component disposed on a surface of the carrier, and a connection element disposed on the surface and adjacent to an edge of the carrier. The encapsulant is disposed on the surface of the carrier and encapsulating the electronic component. The semiconductor device package is attached to the board structure with the edge of the carrier and the edge of the encapsulant facing the surface of the substrate.

In some embodiments, a method for manufacturing a semiconductor device package includes the following operations. An electronic component is disposed on a carrier. An encapsulant is formed on the carrier to encapsulate the electronic component. A connection element is formed on the carrier, wherein a portion of the connection element is exposed from an upper surface and an edge of the encapsulant.

BRIEF DESCRIPTION OF THE DRAWINGS

Aspects of some embodiments of the present disclosure are best understood from the following detailed description when read with the accompanying figures. Various structures may not be drawn to scale, and the dimensions of the various structures may be arbitrarily increased or reduced for clarity of discussion.

FIG. 1A, FIG. 1B, FIG. 1C, FIG. 1D, FIG. 1E, FIG. 1F, FIG. 1G and FIG. 1H illustrate operations of manufacturing a semiconductor device package in accordance with some embodiments of the present disclosure.

FIG. 3A, FIG. 3B and FIG. 3C illustrate operations of manufacturing a semiconductor device package in accordance with some embodiments of the present disclosure.

FIG. 5A, FIG. 5B and FIG. 5C illustrate operations of manufacturing a semiconductor device package in accordance with some embodiments of the present disclosure.

FIG. 7 illustrates a top view or layout of an electronic assembly in accordance with some embodiments of the present disclosure.

FIG. 7A illustrates a cross-sectional view of the electronic assembly across line CC' as shown in FIG. 7.

FIG. 9A illustrates a cross-sectional view of the electronic assembly across line CC' as shown in FIG. 9.

FIG. 10A illustrates a cross-sectional view of the electronic assembly across line CC' as shown in FIG. 10.

DETAILED DESCRIPTION

Figure 1:
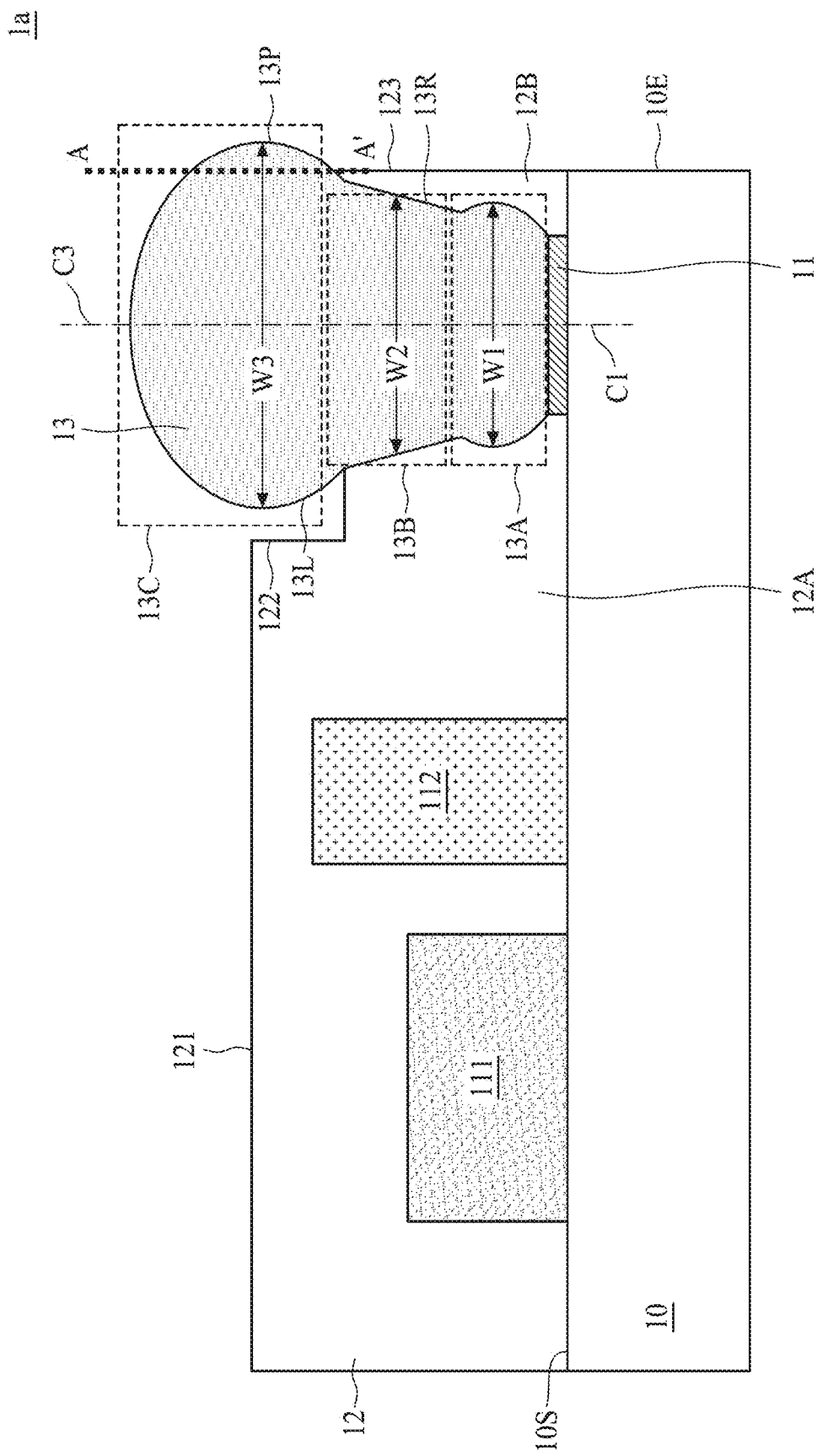
FIG. 1 is a cross-sectional view of a semiconductor device package in accordance with some embodiments of the present disclosure.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features are formed or disposed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that such arrangement does not deviate from the merits of the embodiments of this disclosure.

The present disclosure is directed to a semiconductor device package and an electronic assembly and method for manufacturing the same. The semiconductor device package includes a connection element partially encapsulated by an encapsulant with a portion of the connection element exposed from the upper surface and the edge of the encapsulant. The connection element exposed from the upper surface and the edge of the encapsulant allows the semiconductor device package to be vertically bonded to a board structure to form an electronic assembly. The configuration of the connection element can save the area of the board structure, improve heat dissipation efficiency and increase transmission performance of the electronic assembly.

FIG. 1 is a cross-sectional view of a semiconductor device package 1a in accordance with some embodiments of the present disclosure. As shown in FIG. 1, the semiconductor device package 1a includes a carrier 10, one or more electronic components 111 and 112, an encapsulant 12 and a connection element 13. The carrier 10 may include a substrate, an interposer, a printed circuit board or the like. The carrier 10 may include a circuitry embedded in the carrier 10 and/or disposed on a surface 10S of the carrier 10. The carrier 10 may include conductive pad(s), trace(s), and/or interconnection(s) (e.g. conductive via(s)). The carrier 10 may include a redistribution layer (RDL) structure. The material of the carrier 10 may include, but is not limited to, ceramic, semiconductor material, dielectric material (e.g. epoxy-based material (e.g. FR4), resin-based material (e.g. Bismaleimide-Triazine (BT))), pre-impregnated materials (e.g. prepregs or pp), glass or other suitable materials.

The electronic component 111 and the electronic component 112 are disposed on the surface 10S of the carrier 10. The electronic component 111 and the electronic component 112 may be electrically connected to the carrier 10, and may be electrically connected to each other through the circuitry of the carrier 10. The electronic component 111 may include but is not limited to, for example, a semiconductor device 111. The electronic component 111 may include but is not limited to, for example, an integrated circuit (IC), a semiconductor die or chip having circuitry therein, a Microelectromechanical Systems (MEMS) device, a power die, a power controller, an amplifier, a filter, a sensor, etc. The electronic component 111 is supported by the carrier 10. The electronic component 111 is bonded or attached to the carrier 10 by connection elements (not shown in FIG. 1). The electronic component 111 is bonded or attached to conductive pads (not shown in FIG. 1) of the carrier 10 by connection elements (not shown in FIG. 1). Although one electronic component 111 is shown in FIG. 1 for simplicity, it is contemplated that the semiconductor device package 1a may include more electronic component(s) 111. The electronic component 112 may include but is not limited to, for example, a passive component (e.g. resistor, capacitor, inductor, transformer, etc.). Although one electronic component 112 is shown in FIG. 1 for simplicity, it is contemplated that the semiconductor device package 1a may include more electronic component(s) 112.

The connection element 13 is disposed on the surface 10S of the carrier 10. The connection element 13 may be disposed adjacent to an edge 10E of the carrier 10. The connection element 13 may include solder material such as tin, or other suitable conductive materials such as metal or alloy. The connection element 13 is electrically connected to the carrier 10. The connection element 13 may be further electrically connected to the electronic component 111 and/or the electronic component 112 through the circuitry of the carrier 10. In some other embodiments, the connection element 13 may not be electrically connected to the carrier 10. The connection element 13 is bonded or attached to a conductive pad 11 of the carrier 10. Although one connection element 13 is shown in FIG. 1 for simplicity, it is contemplated that the semiconductor device package 1a may include more connection element(s) 13.

The encapsulant 12 is disposed on the surface 10S of the carrier 10, and encapsulates the electronic components 111 and 112. In some embodiments, the encapsulant 12 may partially or entirely encapsulate lateral edges of the electronic components 111 and 112. The encapsulant 12 may further encapsulate upper surfaces of the electronic components 111 and 112, or alternatively exposed the upper surfaces of the electronic components 111 and 112. The encapsulant may include a thicker portion 12A and a thinner portion 12B. The thicker portion 12A encapsulates the electronic components 111 and 112, and is adjacent to a first side 13L of the connection element 13. The thinner portion 12B is disposed between a second side 13R of the connection element 13 and the edge 10E of the carrier 10. The thinner portion 12B of the encapsulant 12 is thinner than the thick portion 12A. An upper surface 121 of the encapsulant 12 in the thinner portion 12B is lower than that in the thicker portion 12A, and thus a surface 122 is formed due to the thickness difference between the thicker portion 12A and the thinner portion 12B. The thinner portion 12B partially encapsulates lateral sides of the connection element 13, and a portion of the connection element 13 protrudes out from the upper surface 121 of the encapsulant 12, and is exposed from an edge 123 of the encapsulant 12. In some embodiments, the edge 123 of the encapsulant 12 may be substantially coplanar with the edge 10E of the carrier 10. The encapsulant 12 includes but is not limited to, for example, a molding material. By way of example, the molding material may include polymer resin such as polyimide, epoxy resin or the like. The encapsulant 12 includes but is not limited to, for example, fillers or particles (e.g. silicon oxide or the like). The encapsulant 12 may be opaque. The thicker portion 12A and the thinner portion 12B may be formed from the same material, and by the same process.

The connection element 13 is elevationally greater than the upper surface 121 of the encapsulant 12. A portion of the connection element 13 goes or extends over the upper surface 121 of the encapsulant 12 for external connection. In some embodiments, the connection element 13 is separated or spaced from the surface 122 of the encapsulant 12, and thus a gap is formed between the thicker portion 12A of the encapsulant 12 and the first side 13L of the connection element 13. In some embodiments, a portion 13P of the connection element 13 goes or extends over a plane AA', which is an imaginary extension of the edge 123 of the encapsulant 12, for external connection.

In some embodiments, the connection element 13 may include several structures having different profiles connected to one another. By way of example, the connection element 13 includes a connection structure 13A adjacent to the surface 10S of the carrier 10, and another connection structure 13C disposed on the connection structure 13A. In some embodiments, the connection structure 13A and the connection structure 13C each may have a curve profile. By way of example, the connection structure 13A and the connection structure 13C each have a ball-shaped connection structure. The connection structure 13A and the connection structure 13C can be in contact with each other. The connection element 13 may further include, but not be limited to another connection structure 13B disposed between the connection structure 13A and the connection structure 13C. The connection structure 13B may have a substantially straight and inclined profile. By way of example, the connection structure 13B may include a truncated cone connection structure. The connection element 13 may have a neck portion disposed between the connection structure 13A and the connection structure 13B, and another neck portion disposed between the connection structure 13B and the connection structure 13C. The connection structure 13A, the connection structure 13B and the connection structure 13C each may have a maximum width measured along a direction parallel to the surface 10S of the carrier 10. The maximum width W3 of the connection structure 13C is larger than the maximum width W2 of the connection structure 13B, and the maximum width W2 of the connection structure 13B is larger than the maximum width W1 of the connection structure 13A.

In some embodiments, at least some of the connection structure 13A, the connection structure 13B and the connection structure 13C may be disposed symmetrically. For example, the connection structure 13A and the connection structure 13C each may have an imaginary central line normal to the surface 10S of the carrier 10, and the imaginary central line C3 of the connection structure 13C is substantially aligned with the imaginary central line C1 of the connection structure 13A. In some alternative embodiments, at least some of the connection structure 13A, the connection structure 13B and the connection structure 13C may be disposed asymmetrically.

Figure 2:
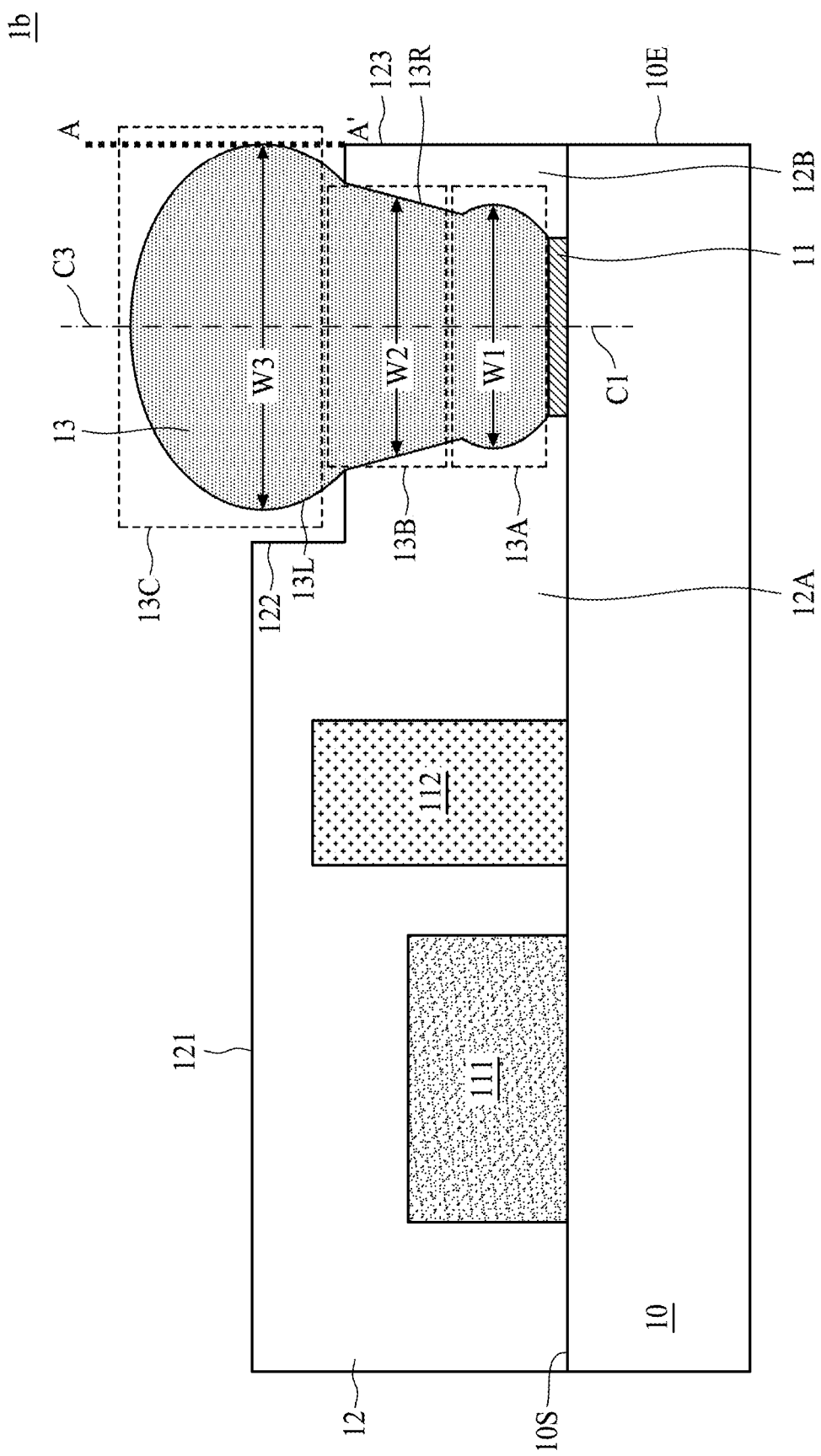
FIG. 2 is a cross-sectional view of a semiconductor device package in accordance with some embodiments of the present disclosure.

In some embodiments, the connection structure 13C of the connection element 13 protrudes out from the edge 123 of the encapsulant 12 as illustrated in FIG. 1. In some alternative embodiments, the connection structure 13C of the connection element 13 may be substantially coplanar with the edge 123 of the encapsulant 12 as illustrated in FIG. 2.

Although it is not illustrated in FIG. 1, it is contemplated that a patterned conductive layer (which may include e.g. an antenna pattern, a circuit layout, an inductor, a capacitor or other electrical components) may be disposed on the carrier 10 or on the encapsulant 12.

FIG. 1A, FIG. 1B, FIG. 1C, FIG. 1D, FIG. 1E, FIG. 1F, FIG. 1G and FIG. 1H illustrate operations of manufacturing a semiconductor device package in accordance with some embodiments of the present disclosure. Referring to FIG. 1A, a carrier substrate 10a is provided. The carrier substrate 10a may include a circular carrier such as a carrier wafer, or a rectangular carrier such as a carrier strip or a carrier panel. The carrier substrate 10a may include a number of carriers 10 as illustrated and described with reference to FIG. 1. The carrier substrate 10a may include a row or column of carriers 10, or an array of carriers 10. Electronic components 111 and electronic components 112 are disposed on the carrier substrate 10a. The electronic components 111 and 112 may be formed on the carrier substrate 10a, or bonded to the carrier substrate 10a by e.g., surface mounting technology (SMT). Connection structures 131 are disposed on the carrier substrate 10a. The connection structure 131 may include conductive material (e.g. metal, alloy, or the like). The connection structure 131 may include a solder material such as a solder ball or solder paste. The electronic components 111, 112 and the connection elements 13 are encapsulated by an encapsulant 12a. Line SS' as shown in FIG. 1A represents a scribe line or a cutting line.

Figure 1C:
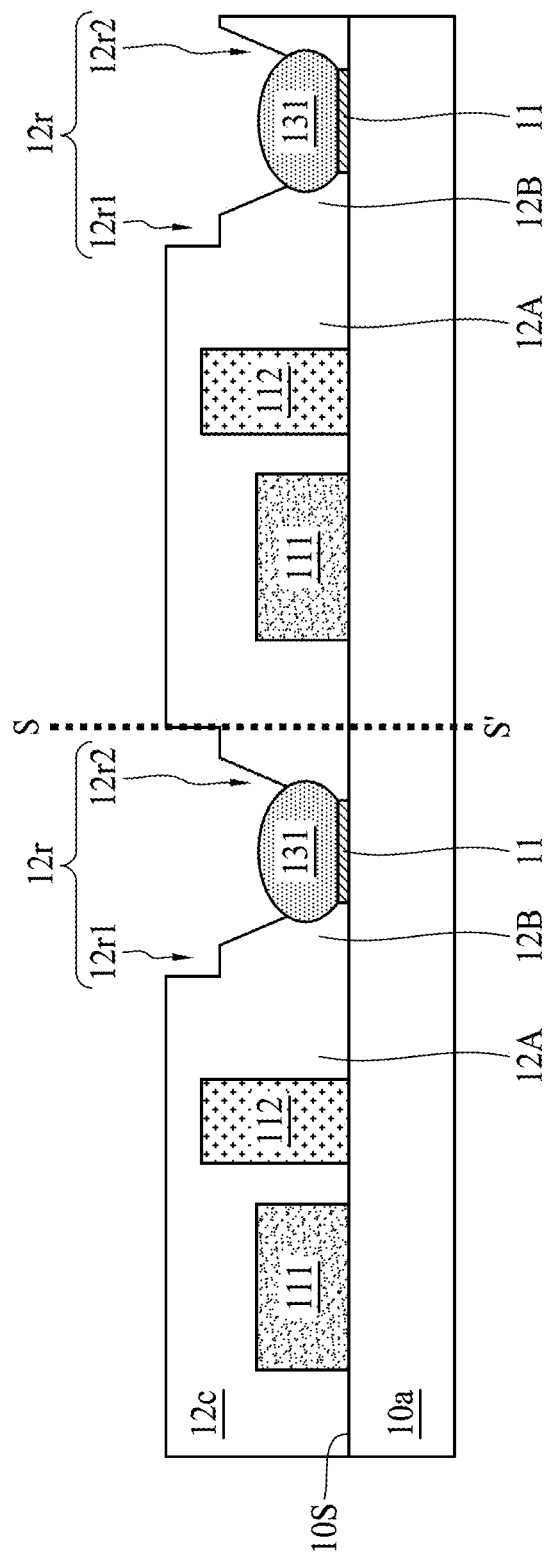

The encapsulant 12a may be partially removed to expose the connection structures 131. The encapsulant 12a may be patterned in a multi-step manner as illustrated in FIG. 1B and FIG. 1C. Referring to FIG. 1B, a portion of encapsulant 12a may be removed to form an encapsulant 12b with first recesses 12r1. By way of example, a portion of encapsulant 12a, which is over the connection structures 131, is removed to form the encapsulant 12b including thicker portions 12A and thinner portions 12B. The thicker portions 12A are disposed over the electronic components 111 and 112, while the thinner portions 12B are disposed over the connection structures 131. In some embodiments, the first recesses 12r1 can be formed mechanically. For example, a cutter such as a wheel cutter can be used to partially remove the encapsulant 12a without cutting through the encapsulant 12a. In some embodiments, the sidewall of the first recesses 12r1 is substantially perpendicular to the surface of the carrier substrate 10a.

Referring to FIG. 1C, a portion of encapsulant 12b, which is over the connection structures 131, is removed again to form second recesses 21r2 exposing the connection structures 131. In some embodiments, the encapsulant 12b can be patterned, but is not limited to, by optical cutting such as laser cutting through the first recesses 12r1 to form the second recesses 21r2 exposing the connection structures 131. The first recess 21r1 and the second recess 21r2 collectively form the recess 21r, and a width of the first recess 21r1 is larger than a width of the second recess 21r2 such the encapsulant 12b may have an inclined profile formed by optical cutting, and a vertical profile formed by mechanical cutting. In some alternative embodiments, the connection structures 131 can be exposed in a single-step manner such as by optical cutting or the like, and the recess 21r may have a designated profile.

Referring to FIG. 1D and FIG. 1E, connection structures 132 are formed on the connection structures 131. In some embodiments, the connection structures 132 may be disposed on the connection structures 131 by, for example but is not limited to, ball mount or implantation techniques. By way of example, the connection structures 132 may be disposed on the connection structures 131 with the help of a patterned stencil plate 14 as illustrated in FIG. 1D and FIG. 1E. The connection structure 132 may include solder paste or solder ball. The material of the connection structure 132 may be the same as or different from that of the connection structure 131.

In some alternative embodiments, the connection structures 132 may be disposed on the connection structures 131 by stencil printing with the help of a patterned stencil plate 14. For example, the connection structures 132 may be dispensed on the patterned stencil plate 14 as illustrated in FIG. 1F, and then pushed to the recesses 12r, covering the connection structures 131 as illustrated in FIG. 1E.

Figure 1H:
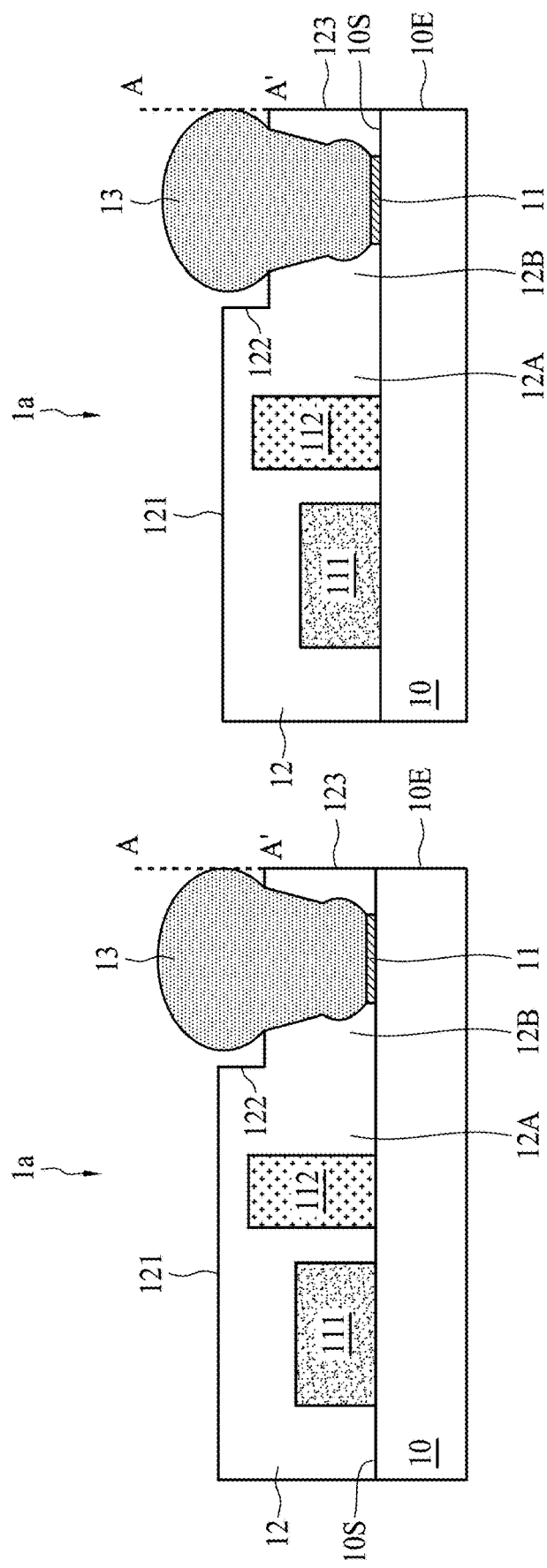

Referring to FIG. 1G, a reflow operation may be performed on the connection structures 131 and 132 as shown in FIG. 1F to form the connection elements 13. Referring to FIG. 1H, a singulation operation or cutting operation may be performed on the structure as shown in FIG. 1G. In some embodiments, another reflow operation may be performed to form the semiconductor device packages 1a with the connection elements 13 protruding out from the edge 123 of the encapsulant 12 as shown in FIG. 1. In some alternative embodiments, the reflow operation after the singulation operation may be omitted, and a semiconductor device package 1b with the connection elements 13 substantially coplanar with the edge 123 of the encapsulant 12 may be formed as shown in FIG. 2.

FIG. 2 is a cross-sectional view of a semiconductor device package 1b in accordance with some embodiments of the present disclosure. The semiconductor device package 1c is similar to the semiconductor device package 1a as illustrated and described with reference to FIG. 1, except that the connection element 13 is substantially coplanar with the edge 123 of the encapsulant 12.

Figure 3:
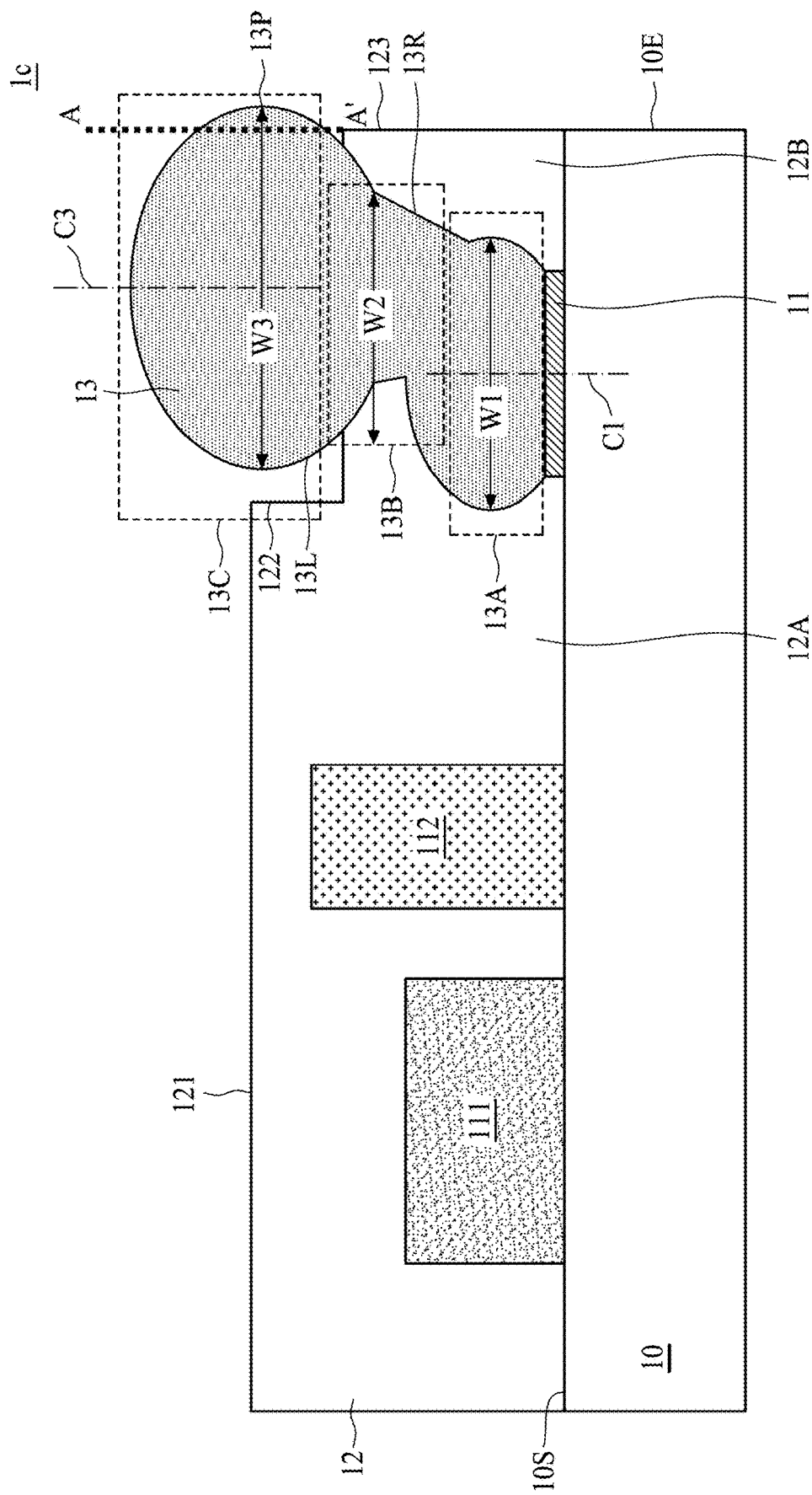
FIG. 3 is a cross-sectional view of a semiconductor device package in accordance with some embodiments of the present disclosure.

FIG. 3 is a cross-sectional view of a semiconductor device package 1c in accordance with some embodiments of the present disclosure. The semiconductor device package 1b is similar to the semiconductor device package 1a as illustrated and described with reference to FIG. 1, except that at least some of the connection structure 13A, the connection structure 13B and the connection structure 13C are disposed asymmetrically. By way of example, the imaginary central line C3 of the connection structure 13C is offset from the imaginary central line C1 of the connection structure 13A toward the edge 123 of the encapsulant 12. The asymmetric design can facilitate external connection with reduced amount of the connection element 13.

Figure 3C:
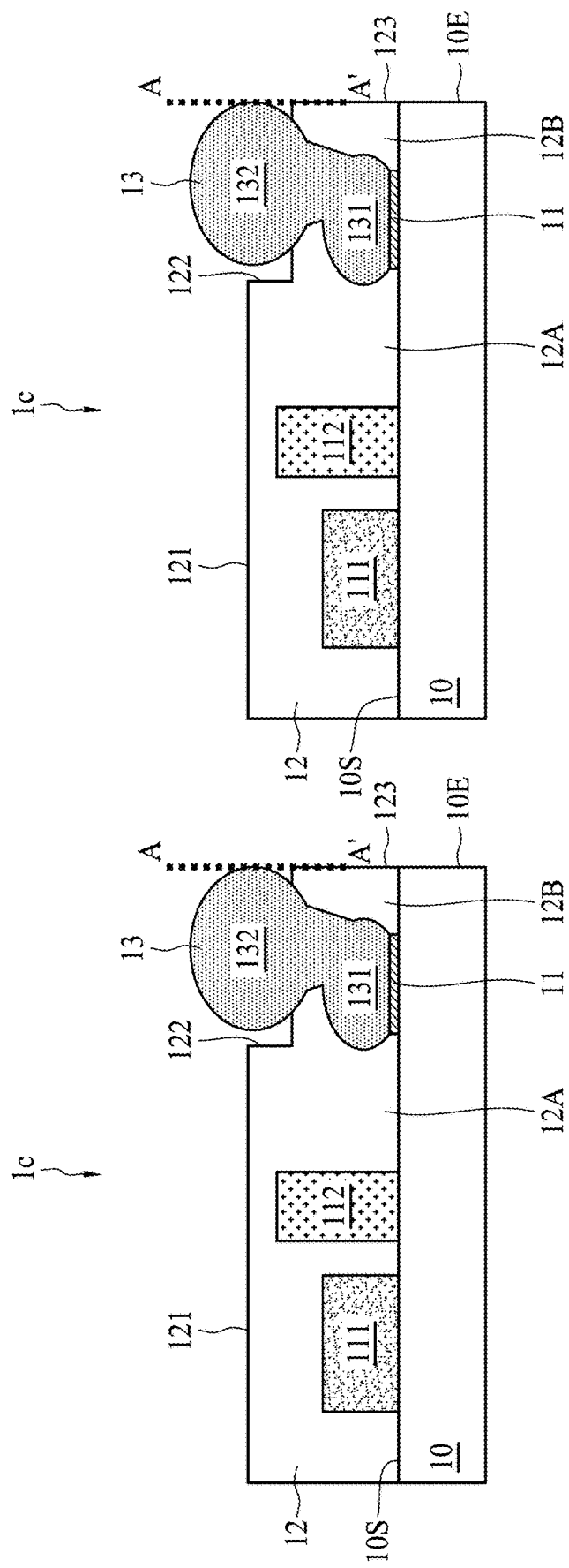

FIG. 3A, FIG. 3B and FIG. 3C illustrate operations of manufacturing a semiconductor device package in accordance with some embodiments of the present disclosure. Referring to FIG. 1A, a carrier substrate 10a is provided. Electronic components 111 and electronic components 112 are disposed on the carrier substrate 10a. The electronic components 111 and 112 may be formed on the carrier substrate 10a, or bonded to the carrier substrate 10a by e.g., surface mounting technology (SMT). Connection structures 131 are disposed on the carrier substrate 10a. The connection structure 131 may include conductive material (e.g. metal, alloy, or the like). The connection structure 131 may include a solder material such as a solder ball or solder paste. The electronic components 111, 112 and connection elements 13 are encapsulated by an encapsulant 12a.

The encapsulant 12a may be partially removed to expose the connection structures 131. The encapsulant 12a may be patterned in a multi-step manner. Referring to FIG. 3A, a portion of encapsulant 12a may be removed to form an encapsulant 12d with recesses 12r. By way of example, a portion of encapsulant 12a, which is over the connection structures 131, is removed to form the encapsulant 12d including thicker portions 12A and thinner portions 12B. The thicker portions 12A are over the electronic components 111 and 112, while the thinner portions 12B are over the connection structures 131. Referring to FIG. 3A again, a portion of encapsulant 12d, which is over the connection structures 131, is removed again to expose the connection structures 131. In some embodiments, the encapsulant 12d can be patterned, but is not limited to, by optical cutting such as laser cutting to form recesses 12r to expose the connection structures 131. The operation shown in FIG. 3A may be similar to the operations shown in FIG. 1B and FIG. 1C, except that the portion being removed in FIG. 1B is shifted toward the scribe line SS' (or right) during the operation shown in FIG. 3A. In other words, a portion of encapsulant 12a, which is over the connection structures 131 but not entirely on top of the connection structures 131, is removed; and then the encapsulant 12d which covers the connection structures 131 is removed to expose the connection structures 131.

Referring to FIG. 3B, connection structures 132 are formed on the connection structures 131 through the recesses 12r. The connection structures 132 may be formed on the connection structures 131 by, for example but is not limited to, ball mount techniques or printing techniques as described in FIG. 1D or FIG. 1F. The connection structure 132 may include solder paste or solder ball. The material of the connection structure 132 may be the same as or different from that of the connection structure 131.

Referring to FIG. 3C, a reflow operation may be performed on the connection structures 131 and 132 to form the connection elements 13. A singulation operation or cutting operation may be performed on the structure as shown in FIG. 3C. In some embodiments, another reflow operation may be performed after the singulation operation to form the semiconductor device packages 1c with the connection elements 13 protruding out from the edge 123 of the encapsulant 12. In some embodiments, the reflow operation after the singulation operation may be omitted, and a semiconductor device package with the connection elements 13 substantially coplanar with the edge 123 of the encapsulant 12 may be formed. As the recess 12r is shifted toward the scribe line SS', the connection element 13 has an asymmetric profile. For example, the imaginary central line C3 of the connection structure 13C is offset from the imaginary central line C1 of the connection structure 13A toward the edge 123 of the encapsulant 12. The asymmetric design can facilitate external connection with reduced amount of the connection element 13.

Figure 4:
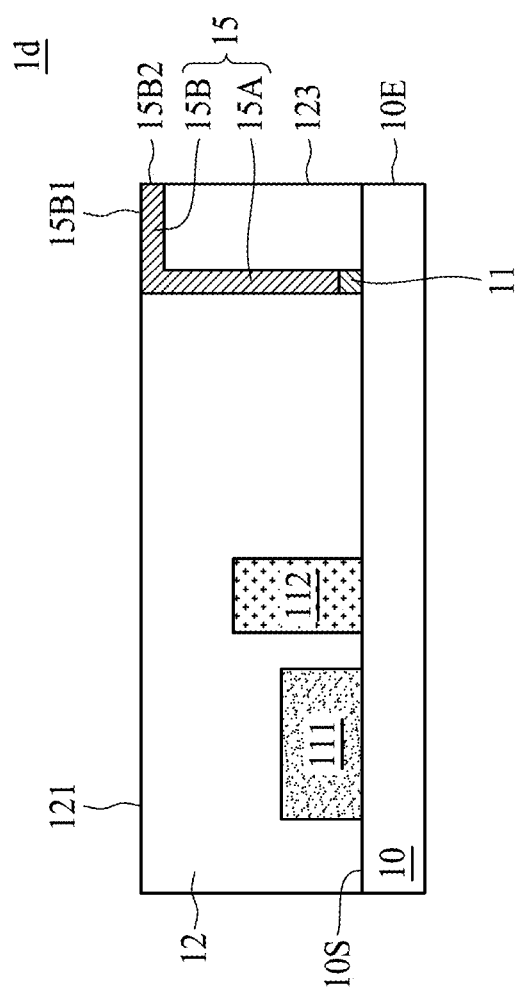
FIG. 4 is a cross-sectional view of a semiconductor device package in accordance with some embodiments of the present disclosure.

FIG. 4 is a cross-sectional view of a semiconductor device package 1d in accordance with some embodiments of the present disclosure. As shown in FIG. 4, the semiconductor device package 1d includes a carrier 10, one or more electronic components 111 and 112, an encapsulant 12, and a connection element 15. In contrast to the semiconductor device package 1a, the connection element 15 of the semiconductor device package 1d may include a metal clip such as copper clip inserted into the encapsulant 12. By way of example, the connection element 15 may include a first connection structure 15A adjacent to the surface 10S of the carrier 10, and a second connection structure 15B disposed on the first connection structure 15A. The first connection structure 15A has a substantially straight profile extending along a direction normal to the surface 10S of the carrier 10. The second connection structure 15B is connected to an end the first connection structure 15A and extending along a direction parallel to the surface 10S of the carrier 10. The second connection structure 15B may include an upper surface 15B1 substantially coplanar with the upper surface 121, or alternatively protruding out from the upper surface 121. The second connection structure 15B may include an edge surface 15B2 substantially coplanar with the edge 123 of the encapsulant 12, or alternatively protruding out from the edge 123. Examples of the material of the connection element 15 may include, for example but is not limited to, copper (Cu), silver (Ag), aluminum (Al), other metal or alloy, or other conductive material(s).

Figure 4A:
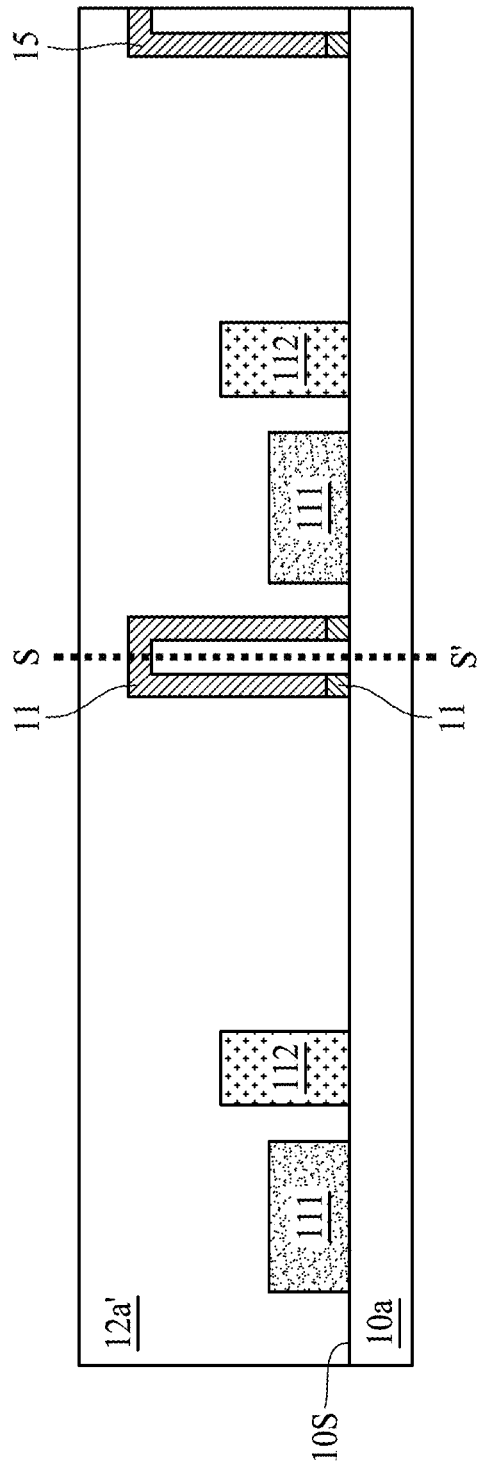
FIG. 4A, FIG. 4B and FIG. 4C illustrate operations of manufacturing a semiconductor device package in accordance with some embodiments of the present disclosure.
Figure 4B:
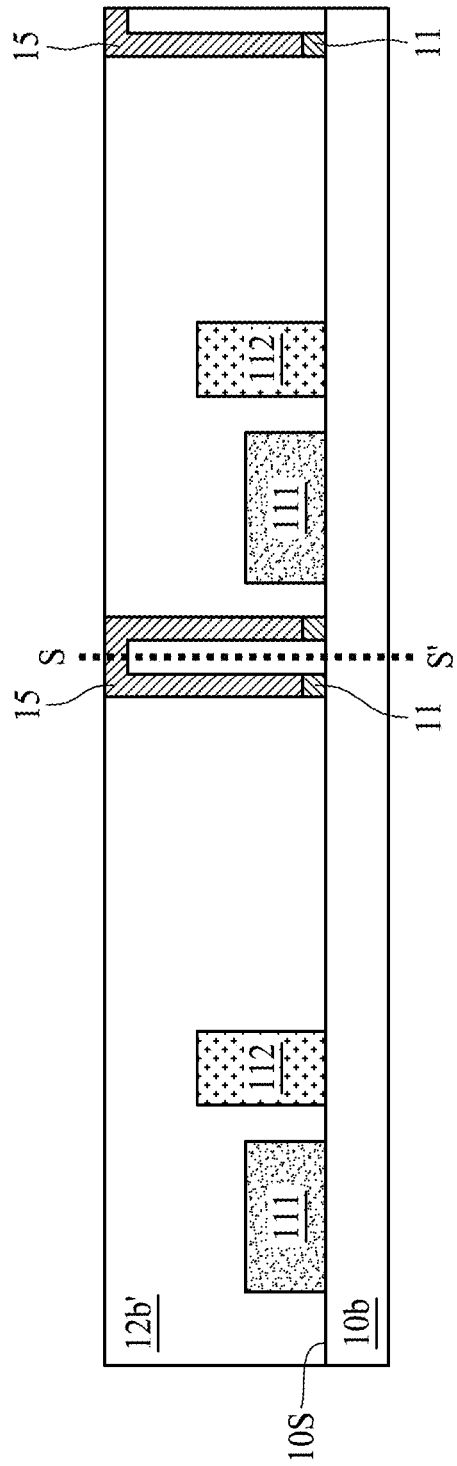
Figure 4C:
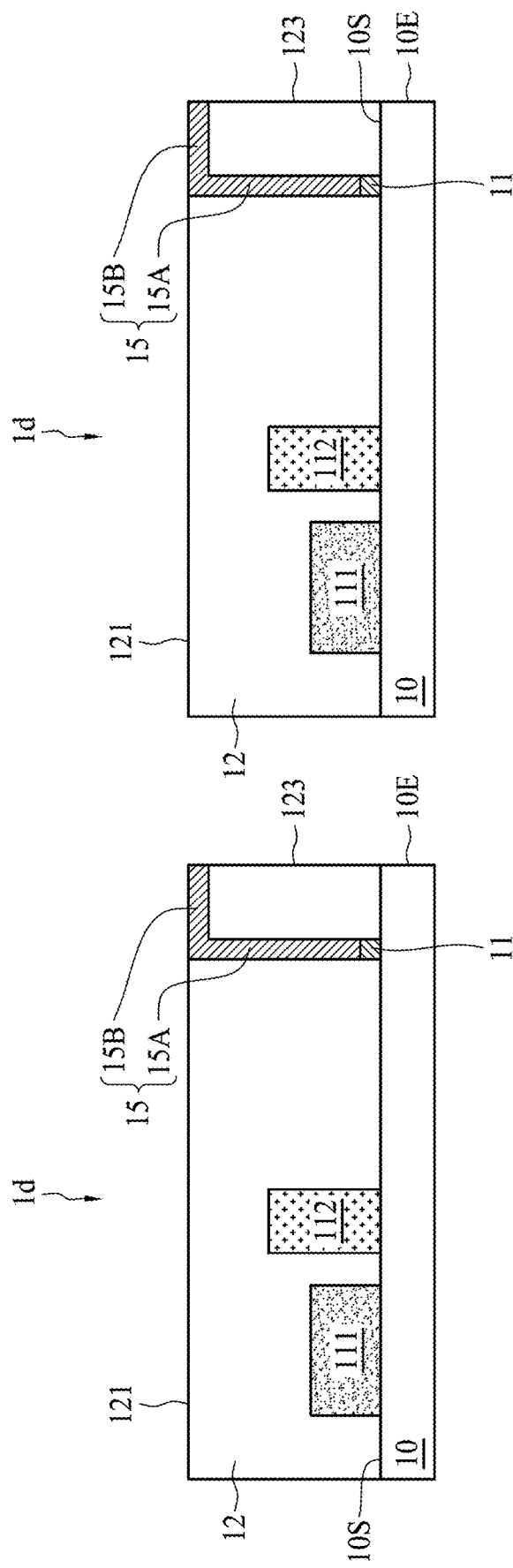

FIG. 4A, FIG. 4B and FIG. 4C illustrate operations of manufacturing a semiconductor device package in accordance with some embodiments of the present disclosure. Referring to FIG. 4A, a carrier substrate 10a is provided. Electronic components 111 and electronic components 112 are disposed on the carrier substrate 10a. The electronic components 111 and 112 may be formed on the carrier substrate 10a, or bonded to the carrier substrate 10a by e.g., surface mounting technology (SMT). Connection elements 15 are formed on the surface 10S of the carrier substrate 10a. In some embodiments, the connection elements 15 are formed on and electrically connected to a conductive pad 11. The electronic components 111, 112 and connection elements 15 are encapsulated by an encapsulant 12a'. Line SS' as shown in FIG. 4A represents a scribe line or a cutting line.

Referring to FIG. 4B, a portion of encapsulant 12a' is removed to form encapsulant 12b'. A portion of encapsulant 12a' is removed by e.g., grinding to expose the conductive elements 15. Referring to FIG. 4C, a singulation operation or cutting operation may be performed to form semiconductor device packages 1d as shown in FIG. 4. A surface treatment operation may be performed subsequent to the singulation operation to remove burr(s) (which may be created during singulation) or other uneven structure.

Figure 5:
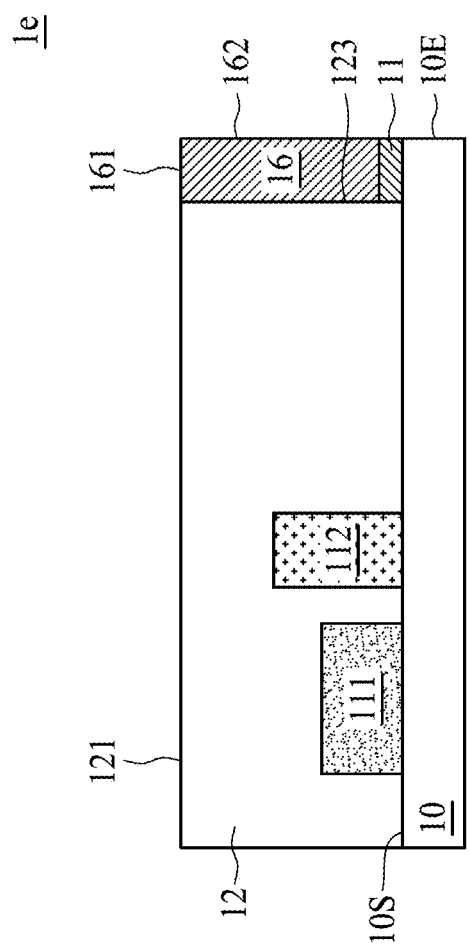
FIG. 5 is a cross-sectional view of a semiconductor device package in accordance with some embodiments of the present disclosure.

FIG. 5 is a cross-sectional view of a semiconductor device package 1e in accordance with some embodiments of the present disclosure. As shown in FIG. 5, the semiconductor device package 1e includes a carrier 10, one or more electronic components 111 and 112, an encapsulant 12, and a conductive structure 16. In contrast to the semiconductor device package 1a, the conductive structure 16 of the semiconductor device package 1e is disposed adjacent to an edge 123 of the encapsulant 12. The conductive structure 16 may include a metal pin such as a copper pin. The conductive structure 16 may cover the edge 123 of the encapsulant 12. The conductive structure 16 may include an upper surface 161 substantially coplanar with the upper surface 121 of the encapsulant 12, or alternatively protruding out from the upper surface 121. The edge 162 of the conductive structure 16 may be substantially coplanar with the edge 10E of the carrier 10, or alternatively protrudes out from the edge 10E. Examples of the material of the conductive structure 16 may include, for example but is not limited to, copper (Cu), silver (Ag), aluminum (Al), other metal or alloy, or other conductive material(s).

Figure 5C:
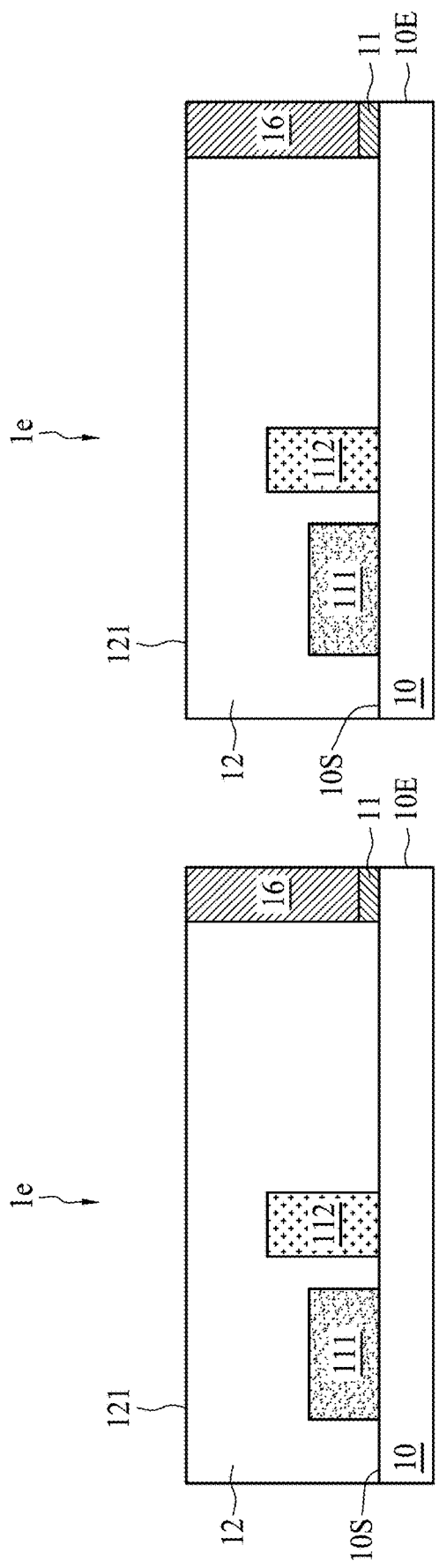

FIG. 5A, FIG. 5B and FIG. 5C illustrate operations of manufacturing a semiconductor device package in accordance with some embodiments of the present disclosure. Referring to FIG. 5A, a carrier substrate 10a is provided. Electronic components 111 and electronic components 112 are disposed on the carrier substrate 10a. The electronic components 111 and 112 may be formed on the carrier substrate 10a, or bonded to the carrier substrate 10a by e.g., surface mounting technology (SMT). Conductive structures 16 are formed on the surface 10S of the carrier substrate 10a. In some embodiments, the conductive structures 16 are formed on and electrically connected to a conductive pad 11. The electronic components 111, 112 and conductive structures 16 are encapsulated by an encapsulant 12a'. Line SS' as shown in FIG. 5A represents a scribe line or a cutting line.

Referring to FIG. 5B, a portion of encapsulant 12a' is removed to form encapsulant 12b'. A portion of encapsulant 12a' is removed by e.g., grinding to expose the conductive structures 16. Referring to FIG. 5C, a singulation operation or cutting operation may be performed to form semiconductor device packages 1e as shown in FIG. 5. A surface treatment operation may be performed subsequent to the singulation operation to remove burr(s) (which may be created during singulation) or other uneven structure.

Figure 6A:
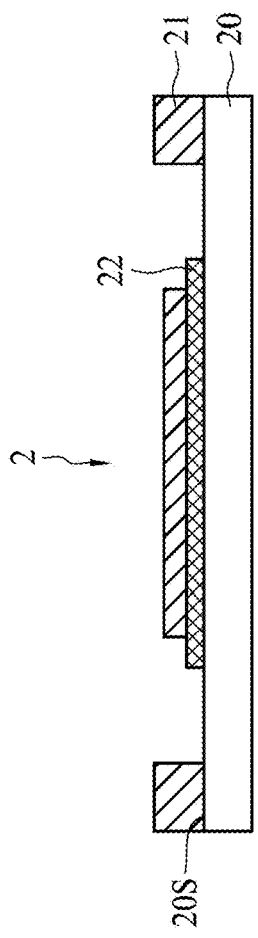
FIG. 6A illustrates a cross-sectional view of the board structure across line BB' as shown in FIG. 6.
Figure 6B:
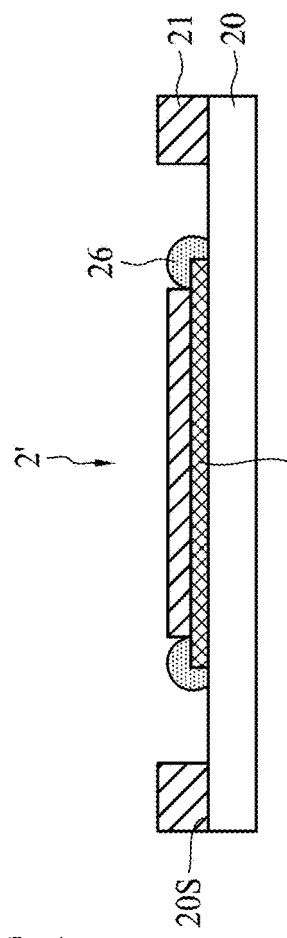
FIG. 6B illustrates a cross-sectional view of another board structure in accordance with some embodiments of the present disclosure.
Figure 6:
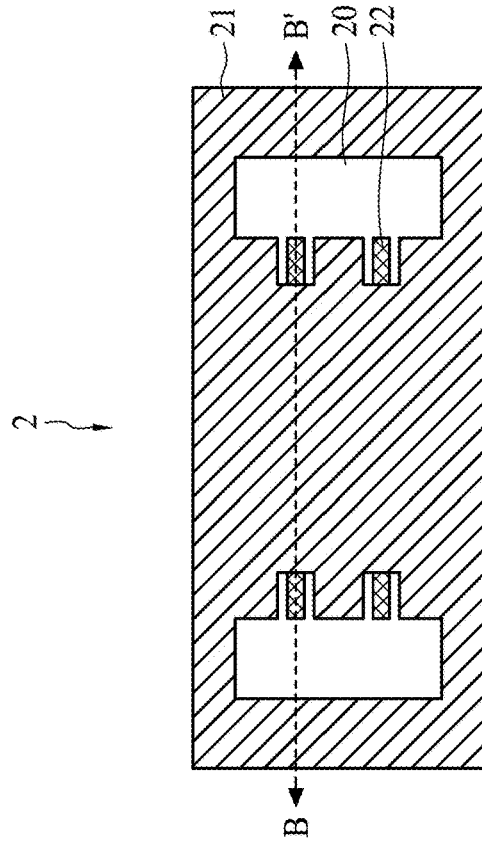
FIG. 6 illustrates a top view or layout of a board structure in accordance with some embodiments of the present disclosure.

FIG. 6 illustrates a top view or layout of a board structure 2 in accordance with some embodiments of the present disclosure, and FIG. 6A illustrates a cross-sectional view of the board structure 2 across line BB' as shown in FIG. 6. Referring to FIG. 6 and FIG. 6A, the board structure 2 includes a substrate 20 and a patterned conductive layer 22 disposed on the surface 20S of the substrate 20. The substrate 20 may be similar to the carrier 10 as described and illustrated with reference to FIG. 1. The patterned conductive layer 22 may include conductive pad(s), trace(s), via(s). In some embodiments, the board structure 2 further includes a protection layer 21 disposed on the substrate 20. The protection layer 21 may include insulation material, dielectric material, passivation material, solder mask material or other suitable material(s). The protection layer 21 may partially cover the patterned conductive layer 22, and partially expose the patterned conductive layer 22 and the surface 20S of the substrate 20. For example, the protection layer 21 may be configured as a solder mask, and the patterned conductive layer 22 may be referred to as non-solder mask defined (NSMD) pad. In some embodiments, other electronic component such as controller chip or the like can be disposed on the substrate 20, and electrically connected to the patterned conductive layer 22

FIG. 6B illustrates a cross-sectional view of another board structure in accordance with some embodiments of the present disclosure. Referring to FIG. 6B, the board structure 2' is similar to the board structure 2 as described and illustrated with reference to FIG. 6A, except that solder structures 26 are disposed on the patterned conductive layer 22. The solder structure 26 covers the patterned conductive layer 22. The solder structure 26 may include solder material, which can help to bond the semiconductor device package(s) of the present disclosure.

FIG. 7 illustrates a top view or layout of an electronic assembly in accordance with some embodiments of the present disclosure, and FIG. 7A illustrates a cross-sectional view of the electronic assembly 3 across line CC' as shown in FIG. 7. Referring to FIG. 7 and FIG. 7A, the electronic assembly 3 includes the semiconductor device package 1a (as described and illustrated with reference to FIG. 1) and the board structure 2 (as described and illustrated with reference to FIG. 6). The semiconductor device package 1a is attached to the board structure 2 by the connection element 13 with the edge 10E of the carrier 10 and the edge 123 of the encapsulant 12 facing the surface 20S of the substrate 20. The connection element 13 may be in contact with an upper surface and an edge of the patterned conductive layer 22 to enhance bonding force between the semiconductor device package 1a and the board structure 2. It is contemplated that the semiconductor device package 1a in the electronic assembly 3 may be replaced by the semiconductor device package 1b, 1c, 1d or 1e as described and illustrated with reference to FIG. 2, FIG. 3, FIG. 4 or FIG. 5). It is contemplated that the board structure 2 in the electronic assembly 3 may be replaced by the board structure 2' as described and illustrated with reference to FIG. 6B). The semiconductor device package 1a is bonded to the board structure 2 in a vertical manner, namely most region of the board structure 2 is not covered by the semiconductor device package 1a. Accordingly, heat generated by the electronic components in the semiconductor device package 1a and/or the board structure 2 can be well dissipated.

Figure 8A:
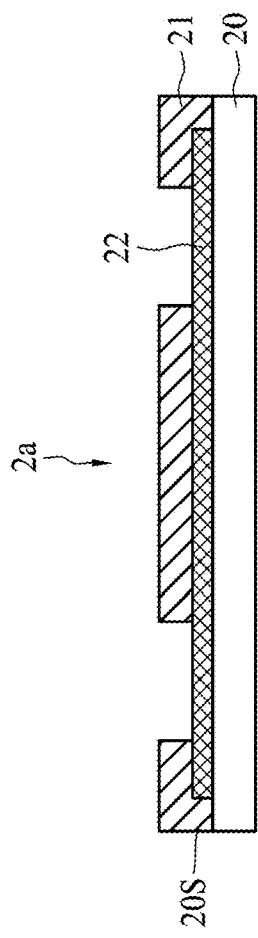
FIG. 8A illustrates a cross-sectional view of the board structure across line BB' as shown in FIG. 8.
Figure 8B:
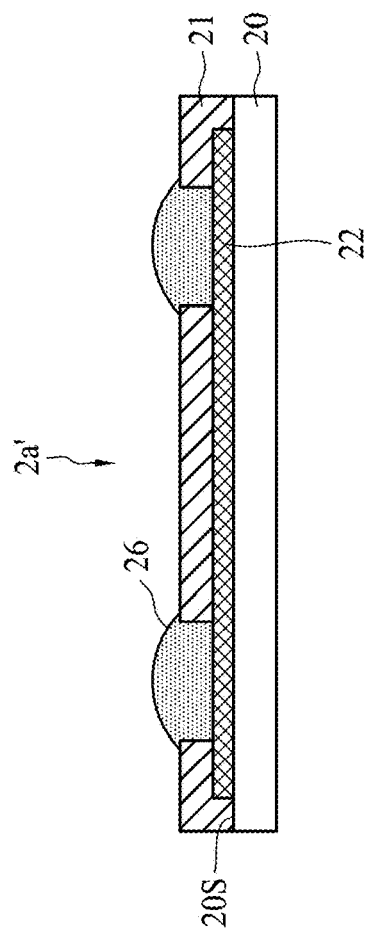
FIG. 8B illustrates a cross-sectional view of another board structure in accordance with some embodiments of the present disclosure.
Figure 8:
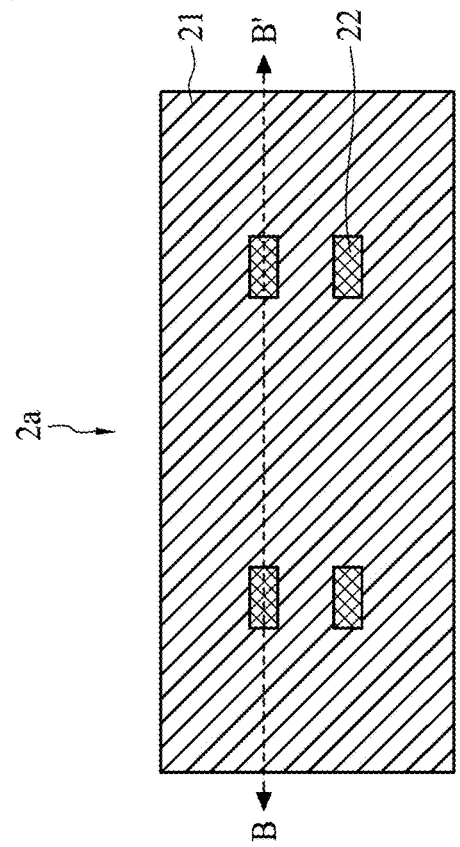
FIG. 8 illustrates a top view or layout of a board structure in accordance with some embodiments of the present disclosure.

FIG. 8 illustrates a top view or layout of a board structure 2a in accordance with some embodiments of the present disclosure, and FIG. 8A illustrates a cross-sectional view of the board structure 2a across line BB' as shown in FIG. 8. Referring to FIG. 8 and FIG. 8A, the board structure 2a is similar to the board structure 2 as illustrated and described with reference to FIG. 6 and FIG. 6A, except that the protection layer 21 covers the surface 20S of the substrate 20, partially covers the patterned conductive layer 22 and partially exposes the patterned conductive layer 22. For example, the protection layer 21 may be configured as a solder mask, and the patterned conductive layer 22 may be referred to as solder mask defined (SMD) pad.

FIG. 8B illustrates a cross-sectional view of another board structure in accordance with some embodiments of the present disclosure. Referring to FIG. 8B, the board structure 2a' is similar to the board structure 2a as described and illustrated with reference to FIG. 8A, except that solder structures 26 are disposed on the patterned conductive layer 22. The solder structure 26 covers the patterned conductive layer 22. The solder structure 26 may include solder material, which can help to bond the semiconductor device package(s) of the present disclosure.

Figure 9:
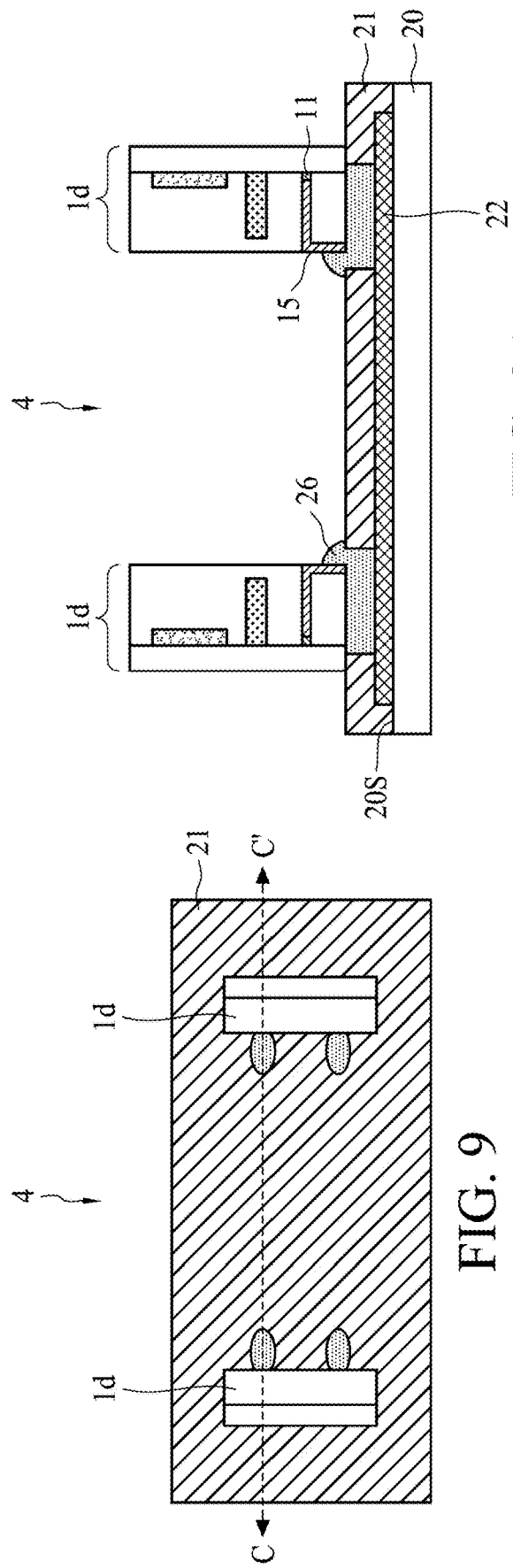
FIG. 9 illustrates a top view or layout of an electronic assembly in accordance with some embodiments of the present disclosure.

FIG. 9 illustrates a top view or layout of an electronic assembly 4 in accordance with some embodiments of the present disclosure, and FIG. 9A illustrates a cross-sectional view of the electronic assembly 4 across line CC' as shown in FIG. 9. Referring to FIG. 9 and FIG. 9A, the electronic assembly 4 includes the semiconductor device package 1d (as described and illustrated with reference to FIG. 4) and the board structure 2a (as described and illustrated with reference to FIG. 8 and FIG. 8A). The semiconductor device package 1d is attached to the board structure 2a by the solder structure 26 with the edge 10E of the carrier 10 and the edge 123 of the encapsulant 12 facing the surface 20S of the substrate 20, and the solder structure 26 electrically connecting the connection element 15. The solder structure 26 may be formed after the semiconductor device package 1d is placed on the board structure 2a, or the solder structure 26 may be formed on the patterned conductive layer 22 before the semiconductor device package 1d is placed on the board structure 2a' (as described and illustrated with reference to FIG. 8b). It is contemplated that the semiconductor device package 1d in the electronic assembly 4 may be replaced by the semiconductor device package 1a, 1b, 1c or 1e as described and illustrated with reference to FIG. 1, FIG. 2, FIG. 3, or FIG. 5). It is contemplated that the board structure 2a in the electronic assembly 4 may be replaced by the board structure 2a' as described and illustrated with reference to FIG. 8B).

Figure 10:
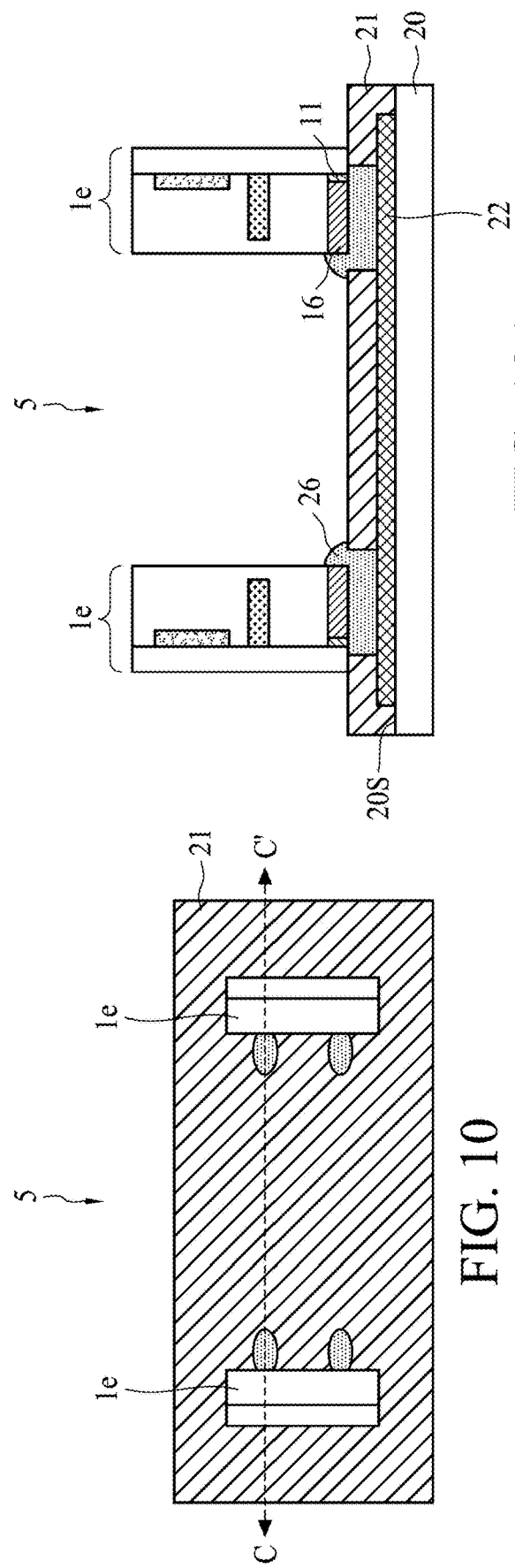
FIG. 10 illustrates a top view or layout of an electronic assembly in accordance with some embodiments of the present disclosure.

FIG. 10 illustrates a top view or layout of an electronic assembly 5 in accordance with some embodiments of the present disclosure, and FIG. 10A illustrates a cross-sectional view of the electronic assembly 5 across line CC' as shown in FIG. 10. Referring to FIG. 10 and FIG. 10A, the electronic assembly 5 includes the semiconductor device package 1e (as described and illustrated with reference to FIG. 5) and the board structure 2a' (as described and illustrated with reference to FIG. 8B). The semiconductor device package 1e is attached to the board structure 2a' by the solder structure 26 with the edge 10E of the carrier 10 and the edge 123 of the encapsulant 12 facing the surface 20S of the substrate 20, and the solder structure 26 electrically connecting the conductive structure 16. In some embodiments, the conductive structure 16 is disposed in the encapsulant 12, and the solder structure 26 connects an upper surface and an edge of the conductive structure 16 to the patterned conductive layer 21. The conductive structure 16 and the solder structure 26 may collectively form a connection element. It is contemplated that the semiconductor device package 1e in the electronic assembly 5 may be replaced by the semiconductor device package 1a, 1b, 1c or 1d as described and illustrated with reference to FIG. 1, FIG. 2, FIG. 3, or FIG. 4). It is contemplated that the board structure 2a in the electronic assembly 4 may be replaced by the board structure 2a as described and illustrated with reference to FIG. 8 and FIG. 8A).

Figure 11:
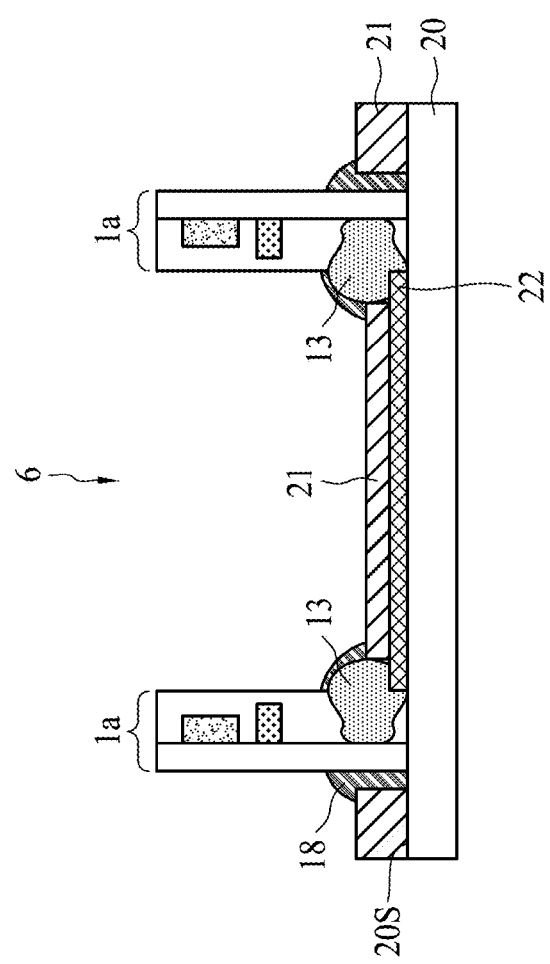
FIG. 11 is a cross-sectional view of an electronic assembly in accordance with some embodiments of the present disclosure.

FIG. 11 is a cross-sectional view of an electronic assembly 6 in accordance with some embodiments of the present disclosure. As shown in FIG. 11, the electronic assembly 6 is similar to the electronic assembly 3 as described and illustrated with reference to FIG. 7A, except that a bonding enhancement layer 18 is disposed on the substrate 20. The bonding enhancement layer 18 may cover the connection element 13, and a portion of the protection layer 21. The bonding enhancement layer 18 may include a glue layer. The bonding enhancement layer 18 may include insulative layer. It is contemplated that the bonding enhancement layer 18 may be applied to the electronic assembly 4 or 5 as described and illustrated with reference to FIG. 9 or FIG. 10).

Figure 12A:
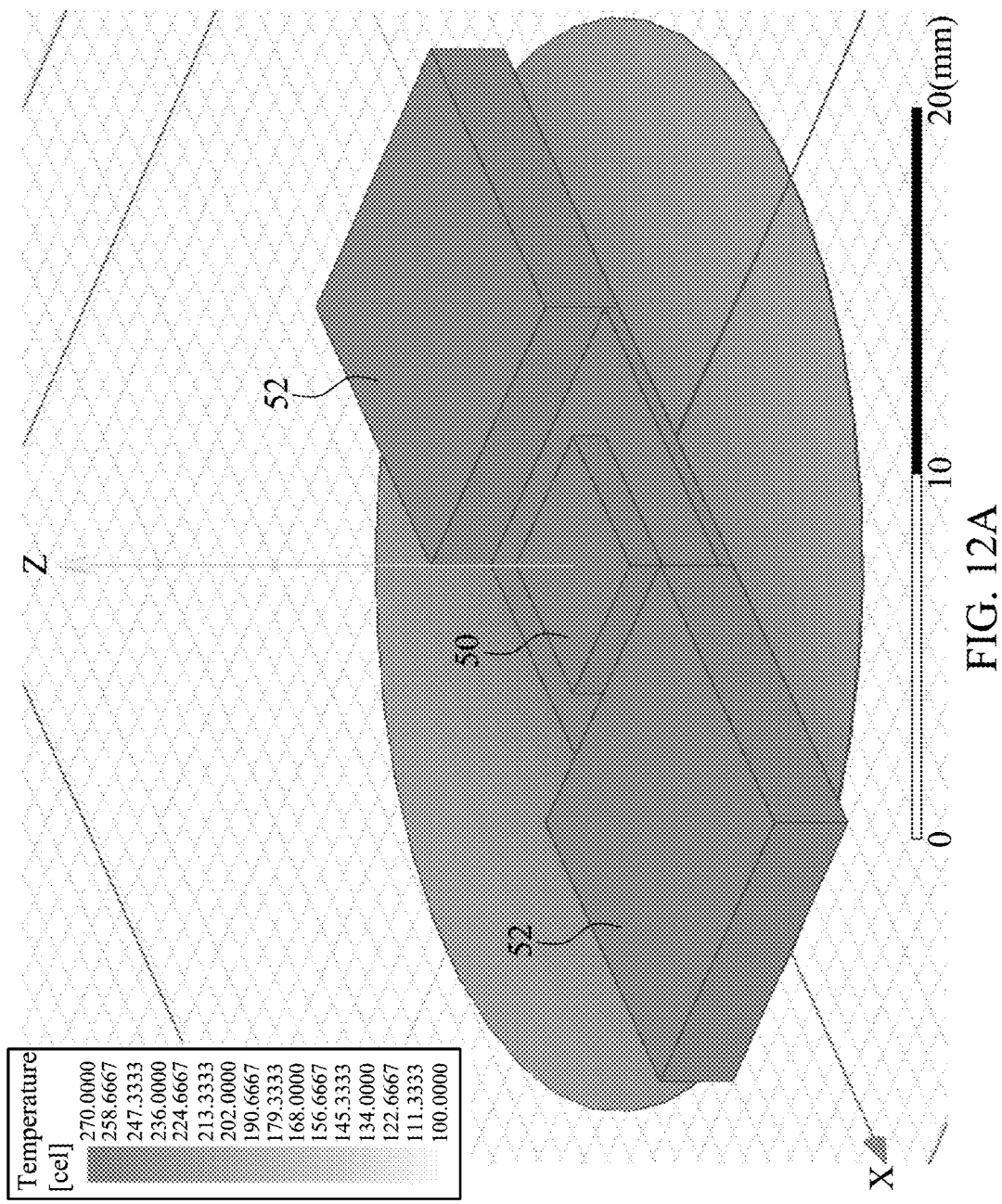
FIG. 12A illustrates an experimental result on another electronic assembly in accordance with some embodiments of the present disclosure.

FIG. 12A illustrates an experimental result on another electronic assembly in accordance with some embodiments of the present disclosure. Referring to FIG. 12A, a controller chip 50 is disposed between two power system-in-package (SIP) type packages 52. Most area of the SIP packages 52 is in contact with the board structure, and thus heat generated from the SIP packages 52 may not be relatively well dissipated and may adversely affect the controller chip 50.

Figure 12B:
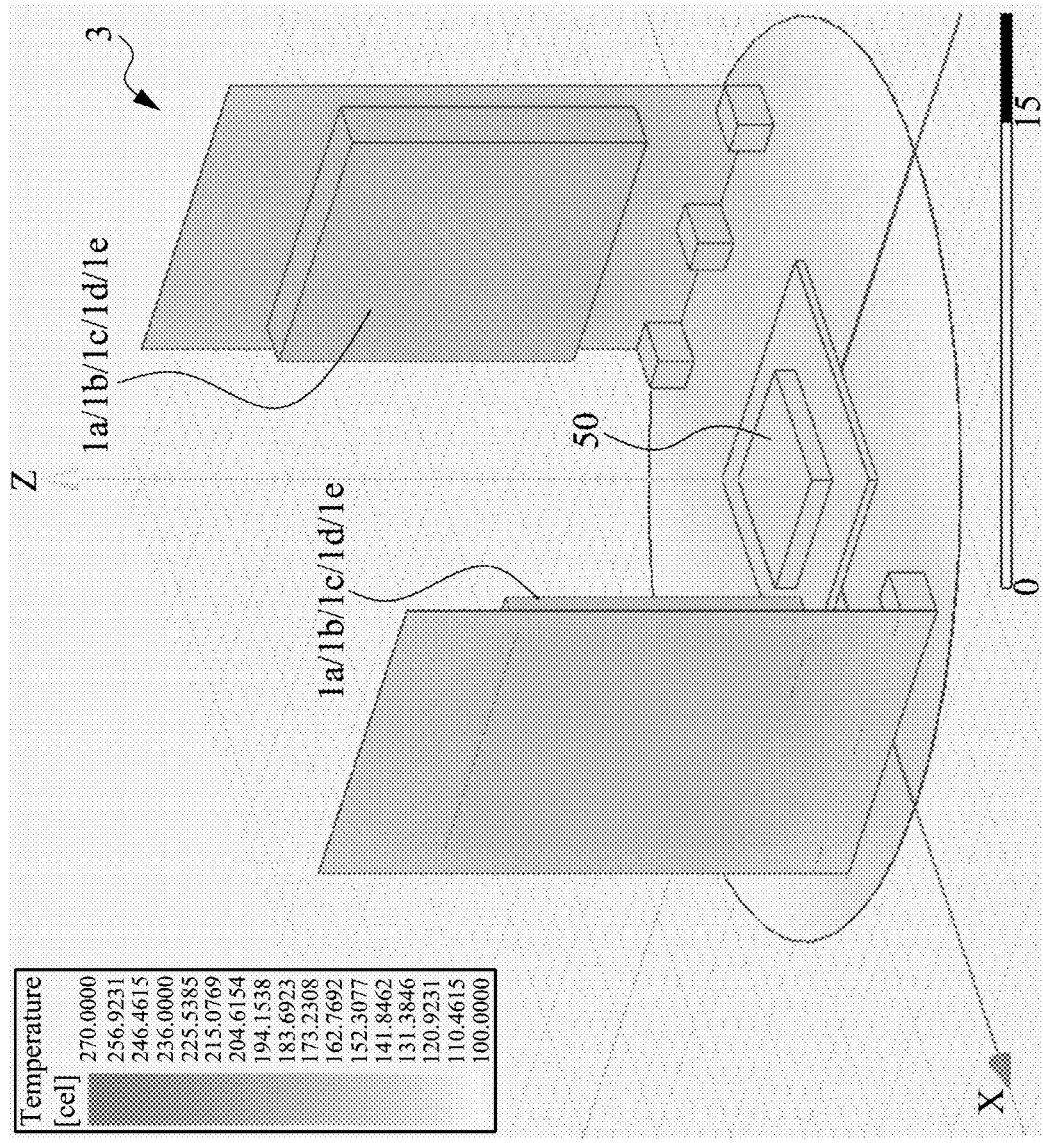
FIG. 12B illustrates an experimental result on the electronic assembly as shown in FIG. 7 and FIG. 7A in accordance with some embodiments of the present disclosure.

FIG. 12B illustrates an experimental result on the electronic assembly 3 as illustrated and described with reference to FIG. 7 and FIG. 7A in accordance with some embodiments of the present disclosure. Referring to FIG. 12B, less area of the semiconductor device package is in direct contact with the board structure 2, and thus heat generated from the semiconductor package 1a, 1b, 1c, 1d or 1e of the electronic assembly 3 is relatively well dissipated.

Figure 13A:
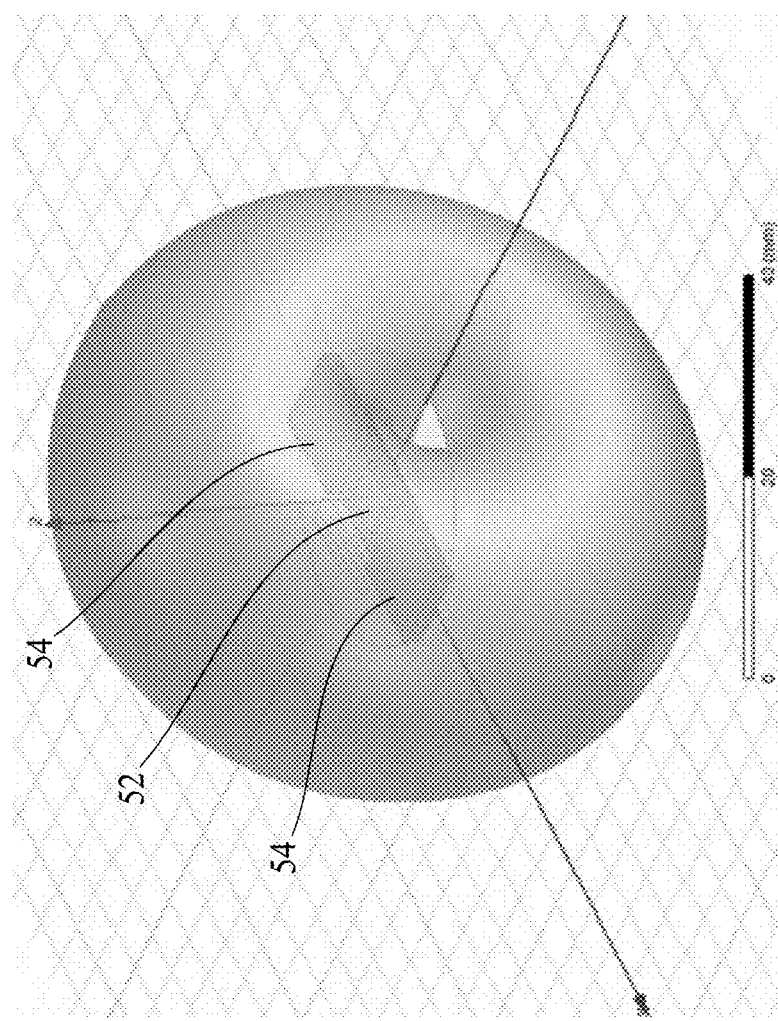
FIG. 13A illustrates radiation pattern of another electronic assembly in accordance with some embodiments of the present disclosure.

FIG. 13A illustrates radiation pattern of another electronic assembly in accordance with some embodiments of the present disclosure. Referring to FIG. 13A, a controller chip 50 is disposed between two antenna packages 54. The antenna package 54 is disposed adjacent to the controller chip 50 in a side by side manner. The electronic assembly may have a peak gain of approximately −1.43 dBi when working in a frequency band of approximately 2.4 GHz. The electronic assembly may have an antenna efficiency of approximately 32% when working in a frequency band of approximately 2.4 GHz.

Figure 13B:
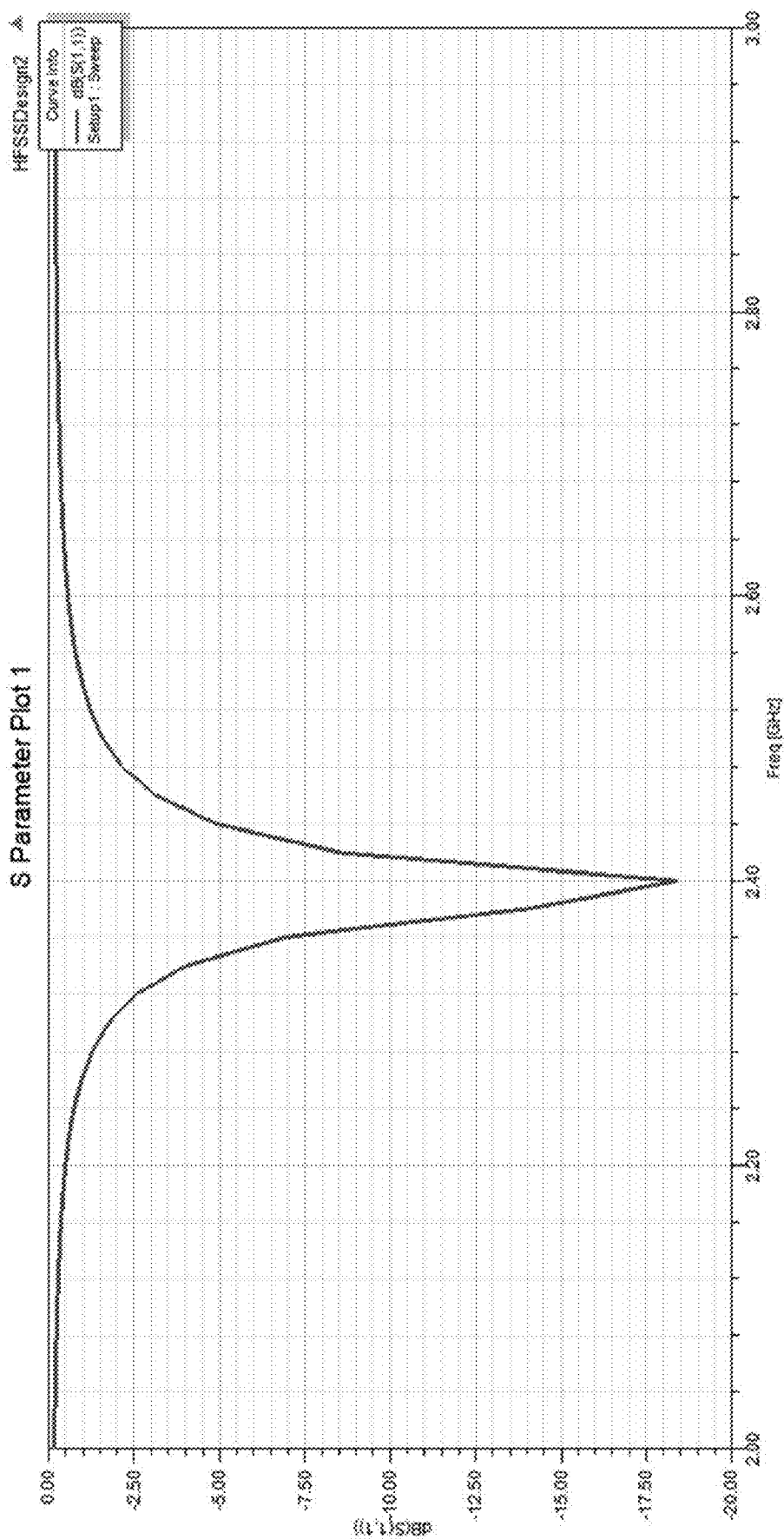
FIG. 13B illustrates an experimental result on the electronic assembly of FIG. 13A in accordance with some embodiments of the present disclosure.

FIG. 13B illustrates an experimental result on the electronic assembly as shown in FIG. 13A in accordance with some embodiments of the present disclosure. Referring to FIG. 13B, the electronic assembly may have return loss (e.g. $S_{11}$ parameter) of approximately −19 dB when working in a frequency band of approximately 2.4 GHz.

Figure 14A:
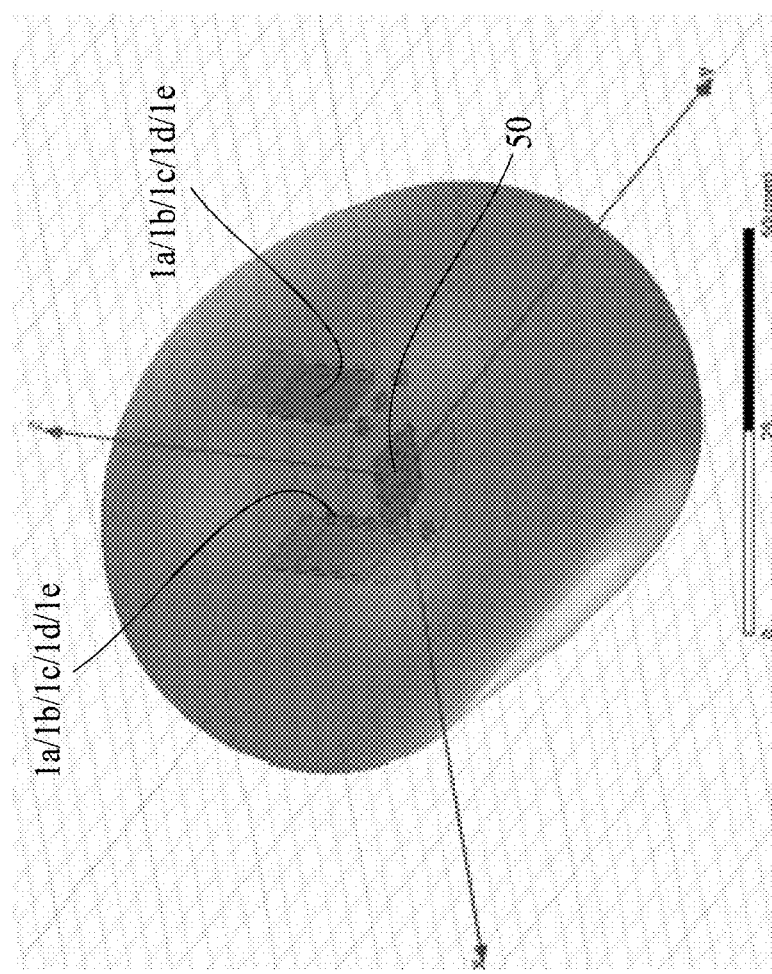
FIG. 14A illustrates radiation pattern of the electronic assembly as shown in FIG. 7 and FIG. 7A in accordance with some embodiments of the present disclosure.

FIG. 14A illustrates radiation pattern of the electronic assembly 3 as shown in FIG. 7 and FIG. 7A in accordance with some embodiments of the present disclosure. The electronic assembly may have a peak gain of approximately 1.3 dBi when working in a frequency band of approximately 2.4 GHz. The electronic assembly may have an antenna efficiency of approximately 60% when working in a frequency band of approximately 2.4 GHz.

Figure 14B:
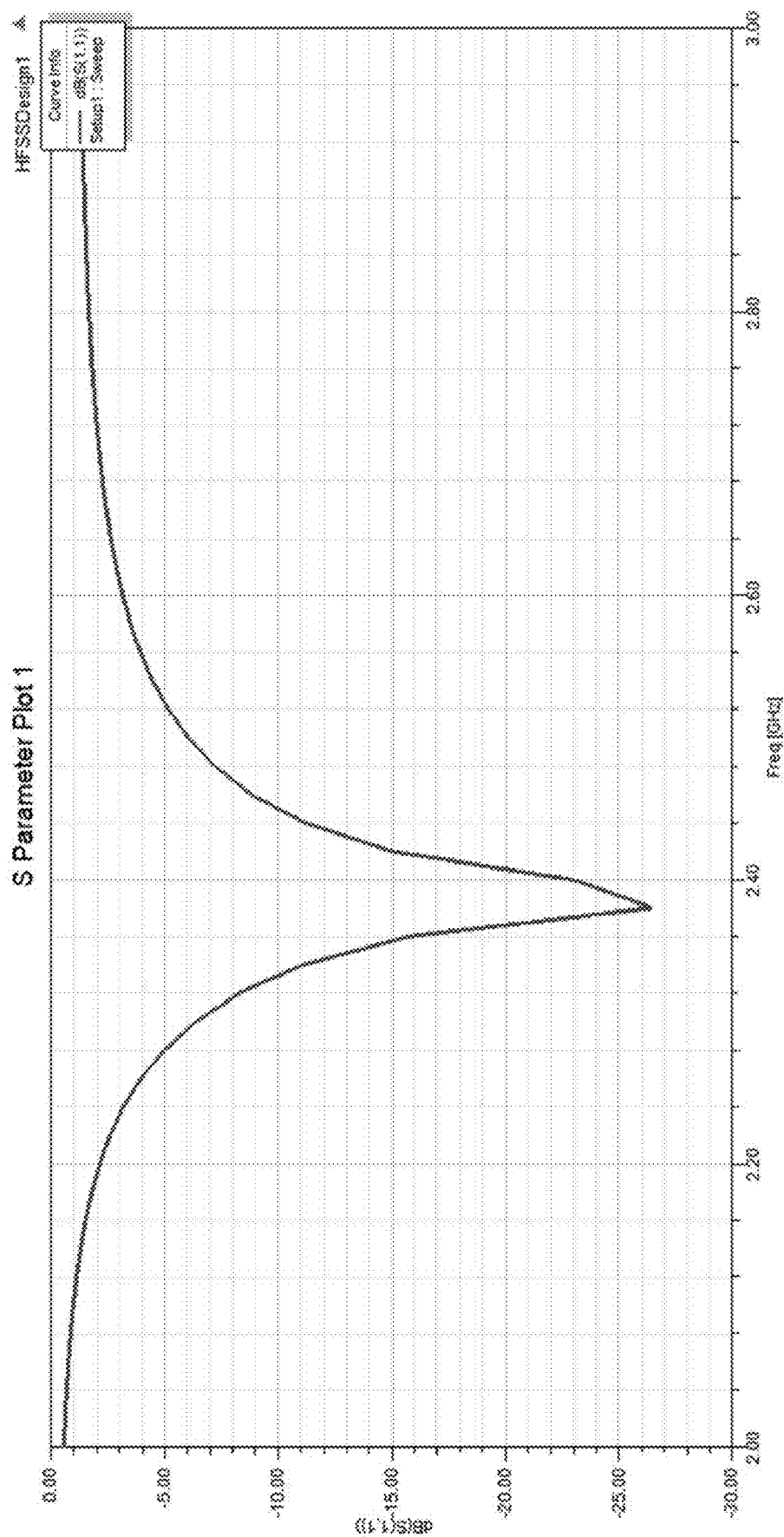
FIG. 14B illustrates an experimental result on the electronic assembly as shown in FIG. 14A in accordance with some embodiments of the present disclosure.

FIG. 14B illustrates an experimental result on the electronic assembly 3 as shown in FIG. 7 and FIG. 7A. Referring to FIG. 14B, the electronic assembly may have return loss (e.g. $S_{11}$ parameter) of approximately −26.5 dB when working in a frequency band of approximately 2.4 GHz.

In some embodiments of the present disclosure, the semiconductor device package includes a connection element partially encapsulated by an encapsulant with a portion of the connection element exposed from the upper surface and the edge of the encapsulant. The connection element exposed from the upper surface and the edge of the encapsulant allows the semiconductor device package to be vertically bonded to a board structure to form an electronic assembly, such that the contact area between the semiconductor device package(s) and the board structure is minimized. The configuration of the connection element can save the area of the board structure, improve heat dissipation efficiency and increase transmission performance of the electronic assembly.

As used herein, the singular terms "a," "an," and "the" may include a plurality of referents unless the context clearly dictates otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if the difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range were explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein are described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations on the present disclosure.

What is claimed is:

1. An electronic assembly, comprising:
a structure including a substrate, a protection layer disposed on the substrate, and a conductive layer disposed on the substrate; and
a semiconductor device package electrically connected to the conductive layer by a connection element, wherein the semiconductor device package has a short side and has a long side substantially perpendicular to the substrate in a cross-sectional perspective,
wherein the protection layer exposes a portion of the conductive layer, and the connection element covers the portion of the conductive layer, and wherein the semiconductor device package comprises:
   a carrier and an electronic component disposed on a lateral surface of the carrier; and
   a conductive structure connected to the carrier and the connection element, wherein an elevation of the conductive structure is lower than an elevation of the electronic component with respect to the substrate.

2. The electronic assembly as claimed in claim 1, wherein the connection element is connected to a lateral side surface of the semiconductor device package.

3. The electronic assembly as claimed in claim 1, wherein at least a portion of the semiconductor device package is disposed over the protection layer.

4. The electronic assembly as claimed in claim 1, wherein the substrate and the protection layer define a space, at least portion of the connection element disposed in the space.

5. The electronic assembly as claimed in claim 1, further comprising a chip disposed over the substrate and electrically connected to the semiconductor device package.

6. An electronic assembly, comprising:
   a structure including a substrate and a conductive layer disposed on the substrate; and
   a semiconductor device package electrically connected to the conductive layer by a connection element, wherein the semiconductor device package has a short side and a long side substantially perpendicular to the substrate in a cross-sectional perspective,
   wherein the connection element comprises a stepped portion defined by the conductive layer, and
   wherein the structure further comprises a protection layer disposed over the substrate and exposing a portion of an upper surface of the substrate and a portion of the conductive layer.

7. The electronic assembly as claimed in claim 6, wherein the semiconductor device package does not vertically overlap the portion of the conductive layer.

8. The electronic assembly as claimed in claim 6, wherein the semiconductor device package has a first edge and a second edge adjacent to the first edge, the first edge and the second edge are substantially perpendicular to the long side, and the first edge is longer than the second edge from a top view perspective.

9. The electronic assembly as claimed in claim 6, wherein the connection element is at least partially protruded beyond a top surface of the semiconductor device package.

10. The electronic assembly as claimed in claim 9, wherein the connection element comprises a protrusion exposed by the semiconductor device package and having a curved surface.

11. The electronic assembly as claimed in claim 6, wherein a distance between inner sidewalls of the connection element is greater than a distance between the connection element and the protection layer.

12. The electronic assembly as claimed in claim 11, wherein the protection layer has at least two sides free from contacting the connection element.

13. The electronic assembly as claimed in claim 12, wherein the at least two sides of the protection layer face the connection element.

* * * * *